(12) United States Patent
Stewart et al.

(10) Patent No.: US 7,876,115 B2
(45) Date of Patent: Jan. 25, 2011

(54) CHUCK FOR HOLDING A DEVICE UNDER TEST

(75) Inventors: Craig Stewart, Banbury (GB); Anthony Lord, Banbury (GB); Jeff Spencer, Portland, OR (US); Terry Burcham, Portland, OR (US); Peter McCann, Beaverton, OR (US); Rod Jones, Portland, OR (US); John Dunklee, Tigard, OR (US); Tim Lesher, Portland, OR (US); David Newton, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 12/378,648

(22) Filed: Feb. 17, 2009

(65) Prior Publication Data

US 2009/0153167 A1 Jun. 18, 2009

Related U.S. Application Data

(63) Continuation of application No. 10/829,869, filed on Apr. 21, 2004, now Pat. No. 7,492,172.

(60) Provisional application No. 60/473,232, filed on May 23, 2003.

(51) Int. Cl.
*G01R 31/02* (2006.01)
*G01R 31/00* (2006.01)

(52) U.S. Cl. .................. 324/754; 324/756; 324/758; 324/761; 324/765

(58) Field of Classification Search .......... 324/754–765
See application file for complete search history.

(56) References Cited

U.S. PATENT DOCUMENTS

| 1,191,486 A | 7/1916 | Tyler |
| 1,337,866 A | 4/1920 | Whitacker |
| 2,106,003 A | 1/1938 | Hewitt |
| 2,142,625 A | 1/1939 | Zoethout |
| 2,197,081 A | 4/1940 | Piron |

(Continued)

FOREIGN PATENT DOCUMENTS

DE 29 12 826 10/1980

(Continued)

OTHER PUBLICATIONS

Mark S. Boguski and Martin W. McIntosh, "Biomedical informatics for proteomics," insight: review article, Nature 422, 233-237 (2003); doi:10.1038/nature01515.

(Continued)

*Primary Examiner*—Ha Tran T Nguyen
*Assistant Examiner*—Emily Y Chan
(74) *Attorney, Agent, or Firm*—Chernoff, Vilhauer, McClung & Stenzel

(57) ABSTRACT

A chuck includes a conductive element that contacts a device under test in a location on the chuck. The chuck includes an upper surface for supporting a device under test and a conductive element that extends through the chuck to the upper surface of the chuck. The conductive element is electrically isolated from the upper surface of the chuck, and makes electrical contact with any device under test supported by the chuck.

4 Claims, 15 Drawing Sheets

U.S. PATENT DOCUMENTS

| | | |
|---|---|---|
| 2,264,685 A | 12/1941 | Wells et al. |
| 2,376,101 A | 5/1945 | Tyzzer |
| 2,389,668 A | 11/1945 | Johnson |
| 2,471,897 A | 5/1949 | Rappi |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziekowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,359,014 A | 12/1967 | Clements |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,642,415 A | 2/1972 | Johnson |
| 3,648,169 A | 3/1972 | Wiesler |
| 3,654,573 A | 4/1972 | Graham |
| 3,662,318 A | 5/1972 | Decuyper |
| 3,666,296 A | 5/1972 | Fischetti |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,838 A | 6/1974 | Shafer |
| 3,814,888 A | 6/1974 | Bowers et al. |
| 3,829,076 A | 8/1974 | Sofy |
| 3,836,751 A | 9/1974 | Anderson |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A * | 9/1982 | Matrone ..................... 324/754 |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,783 A | 8/1987 | Gore |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,709,141 A | 11/1987 | Olsen et al. |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |

| Patent Number | Kind | Date | Inventor |
|---|---|---|---|
| 4,742,571 | A | 5/1988 | Letron |
| 4,744,041 | A | 5/1988 | Strunk et al. |
| 4,746,857 | A | 5/1988 | Sakai et al. |
| 4,754,239 | A | 6/1988 | Sedivec |
| 4,755,746 | A | 7/1988 | Mallory et al. |
| 4,755,747 | A | 7/1988 | Sato |
| 4,755,874 | A | 7/1988 | Esrig et al. |
| 4,757,255 | A | 7/1988 | Margozzi |
| 4,758,785 | A | 7/1988 | Rath |
| 4,759,712 | A | 7/1988 | Demand |
| 4,766,384 | A | 8/1988 | Kleinberg et al. |
| 4,771,234 | A | 9/1988 | Cook et al. |
| 4,772,846 | A | 9/1988 | Reeds |
| 4,777,434 | A | 10/1988 | Miller et al. |
| 4,780,670 | A | 10/1988 | Cherry |
| 4,783,625 | A | 11/1988 | Harry et al. |
| 4,784,213 | A | 11/1988 | Eager et al. |
| 4,786,867 | A | 11/1988 | Yamatsu |
| 4,787,752 | A | 11/1988 | Fraser et al. |
| 4,791,363 | A | 12/1988 | Logan |
| 4,795,962 | A | 1/1989 | Yanagawa et al. |
| 4,805,627 | A | 2/1989 | Klingenbeck et al. |
| 4,810,981 | A | 3/1989 | Herstein |
| 4,812,754 | A | 3/1989 | Tracy et al. |
| 4,816,767 | A | 3/1989 | Cannon et al. |
| 4,818,169 | A | 4/1989 | Schram et al. |
| 4,827,211 | A | 5/1989 | Strid et al. |
| 4,831,494 | A | 5/1989 | Arnold et al. |
| 4,838,802 | A | 6/1989 | Soar |
| 4,839,587 | A | 6/1989 | Flatley et al. |
| 4,845,426 | A | 7/1989 | Nolan et al. |
| 4,849,689 | A | 7/1989 | Gleason et al. |
| 4,853,613 | A | 8/1989 | Sequeira et al. |
| 4,853,624 | A | 8/1989 | Rabjohn |
| 4,853,627 | A | 8/1989 | Gleason et al. |
| 4,856,426 | A | 8/1989 | Wirz |
| 4,856,904 | A | 8/1989 | Akagawa |
| 4,858,160 | A | 8/1989 | Strid et al. |
| 4,859,989 | A | 8/1989 | McPherson |
| 4,864,227 | A | 9/1989 | Sato |
| 4,871,883 | A | 10/1989 | Guiol |
| 4,871,965 | A | 10/1989 | Elbert et al. |
| 4,884,026 | A | 11/1989 | Hayakawa et al. |
| 4,884,206 | A | 11/1989 | Mate |
| 4,888,550 | A | 12/1989 | Reid |
| 4,891,584 | A | 1/1990 | Kamieniecki et al. |
| 4,893,914 | A | 1/1990 | Hancock et al. |
| 4,894,612 | A | 1/1990 | Drake et al. |
| 4,896,109 | A | 1/1990 | Rauscher |
| 4,899,998 | A | 2/1990 | Teramachi |
| 4,904,933 | A | 2/1990 | Snyder et al. |
| 4,904,935 | A | 2/1990 | Calma et al. |
| 4,906,920 | A | 3/1990 | Huff et al. |
| 4,916,398 | A | 4/1990 | Rath |
| 4,918,279 | A | 4/1990 | Babel et al. |
| 4,918,374 | A | 4/1990 | Stewart et al. |
| 4,918,383 | A | 4/1990 | Huff et al. |
| 4,922,128 | A | 5/1990 | Dhong et al. |
| 4,922,186 | A | 5/1990 | Tsuchiya et al. |
| 4,923,407 | A | 5/1990 | Rice et al. |
| 4,926,118 | A | 5/1990 | O'Connor et al. |
| 4,929,893 | A | 5/1990 | Sato et al. |
| 4,933,634 | A | 6/1990 | Cuzin et al. |
| 4,968,931 | A | 11/1990 | Littlebury et al. |
| 4,978,907 | A | 12/1990 | Smith |
| 4,978,914 | A | 12/1990 | Akimoto et al. |
| 4,982,153 | A | 1/1991 | Collins et al. |
| 4,994,737 | A | 2/1991 | Carlton et al. |
| 5,001,423 | A | 3/1991 | Abrami et al. |
| 5,006,796 | A | 4/1991 | Burton et al. |
| 5,010,296 | A | 4/1991 | Okada et al. |
| 5,019,692 | A | 5/1991 | Nbedi et al. |
| 5,030,907 | A | 7/1991 | Yih et al. |
| 5,034,688 | A | 7/1991 | Moulene et al. |
| 5,041,782 | A | 8/1991 | Marzan |
| 5,045,781 | A | 9/1991 | Gleason et al. |
| 5,061,823 | A | 10/1991 | Carroll |
| 5,065,089 | A | 11/1991 | Rich |
| 5,065,092 | A | 11/1991 | Sigler |
| 5,066,357 | A | 11/1991 | Smyth, Jr. et al. |
| 5,070,297 | A | 12/1991 | Kwon et al. |
| 5,077,523 | A | 12/1991 | Blanz |
| 5,082,627 | A | 1/1992 | Stanbro |
| 5,084,671 | A | 1/1992 | Miyata et al. |
| 5,089,774 | A | 2/1992 | Nakano |
| 5,091,691 | A | 2/1992 | Kamieniecki et al. |
| 5,091,692 | A | 2/1992 | Ohno et al. |
| 5,091,732 | A | 2/1992 | Mileski et al. |
| 5,094,536 | A | 3/1992 | MacDonald et al. |
| 5,095,891 | A | 3/1992 | Reitter |
| 5,097,207 | A | 3/1992 | Blanz |
| 5,101,149 | A | 3/1992 | Adams et al. |
| 5,101,453 | A | 3/1992 | Rumbaugh |
| 5,103,169 | A | 4/1992 | Heaton et al. |
| 5,105,148 | A | 4/1992 | Lee |
| 5,105,181 | A | 4/1992 | Ross |
| 5,107,076 | A | 4/1992 | Bullock et al. |
| 5,136,237 | A | 8/1992 | Smith et al. |
| 5,142,224 | A | 8/1992 | Smith et al. |
| 5,144,228 | A | 9/1992 | Sorna et al. |
| 5,159,264 | A | 10/1992 | Anderson |
| 5,159,267 | A | 10/1992 | Anderson |
| 5,159,752 | A | 11/1992 | Mahant-Shetti et al. |
| 5,160,883 | A | 11/1992 | Blanz |
| 5,164,319 | A | 11/1992 | Hafeman et al. |
| 5,164,661 | A | 11/1992 | Jones |
| 5,166,606 | A | 11/1992 | Blanz |
| 5,172,049 | A | 12/1992 | Kiyokawa et al. |
| 5,172,051 | A | 12/1992 | Zamborelli |
| 5,187,443 | A | 2/1993 | Bereskin |
| 5,198,752 | A | 3/1993 | Miyata et al. |
| 5,198,753 | A | 3/1993 | Hamburgen |
| 5,198,756 | A | 3/1993 | Jenkins et al. |
| 5,198,758 | A | 3/1993 | Iknaian et al. |
| 5,202,558 | A | 4/1993 | Barker |
| 5,209,088 | A | 5/1993 | Vaks |
| 5,210,377 | A | 5/1993 | Kennedy et al. |
| 5,210,485 | A | 5/1993 | Kreiger et al. |
| 5,214,243 | A | 5/1993 | Johnson |
| 5,214,374 | A | 5/1993 | St. Onge |
| 5,218,185 | A | 6/1993 | Gross |
| 5,220,277 | A | 6/1993 | Reitinger |
| 5,221,905 | A | 6/1993 | Bhangu et al. |
| 5,225,037 | A | 7/1993 | Elder et al. |
| 5,225,796 | A | 7/1993 | Williams et al. |
| 5,227,730 | A | 7/1993 | King et al. |
| 5,232,789 | A | 8/1993 | Platz et al. |
| 5,233,197 | A | 8/1993 | Bowman et al. |
| 5,233,291 | A | 8/1993 | Kouno et al. |
| 5,233,306 | A | 8/1993 | Misra |
| 5,237,267 | A | 8/1993 | Harwood et al. |
| 5,245,292 | A | 9/1993 | Milesky et al. |
| 5,266,889 | A | 11/1993 | Harwood et al. |
| 5,267,088 | A | 11/1993 | Nomura |
| 5,270,664 | A | 12/1993 | McMurtry et al. |
| 5,274,336 | A | 12/1993 | Crook et al. |
| 5,278,494 | A | 1/1994 | Obigane |
| 5,280,156 | A | 1/1994 | Niori et al. |
| 5,298,972 | A | 3/1994 | Heffner |
| 5,303,938 | A | 4/1994 | Miller et al. |
| 5,304,924 | A | 4/1994 | Yamano et al. |
| 5,315,237 | A | 5/1994 | Iwakura et al. |
| 5,321,352 | A | 6/1994 | Takebuchi |
| 5,321,453 | A | 6/1994 | Mori et al. |
| 5,325,052 | A | 6/1994 | Yamashita |
| 5,334,931 | A | 8/1994 | Clarke et al. |

| | | | | | |
|---|---|---|---|---|---|
| 5,336,989 A | 8/1994 | Hofer | 5,600,256 A | 2/1997 | Woith et al. |
| 5,345,170 A | 9/1994 | Schwindt et al. | 5,604,444 A | 2/1997 | Harwood et al. |
| 5,357,211 A | 10/1994 | Bryson et al. | 5,610,529 A | 3/1997 | Schwindt |
| 5,363,050 A | 11/1994 | Guo et al. | 5,611,946 A | 3/1997 | Leong et al. |
| 5,369,368 A | 11/1994 | Kassen et al. | 5,617,035 A | 4/1997 | Swapp |
| 5,369,370 A | 11/1994 | Stratmann et al. | 5,628,057 A | 5/1997 | Phillips et al. |
| 5,371,457 A | 12/1994 | Lipp | 5,629,631 A | 5/1997 | Perry et al. |
| 5,373,231 A | 12/1994 | Boll et al. | 5,631,571 A | 5/1997 | Spaziani et al. |
| 5,374,938 A | 12/1994 | Hatazawa et al. | 5,633,780 A | 5/1997 | Cronin |
| 5,376,790 A | 12/1994 | Linker et al. | 5,640,101 A | 6/1997 | Kuji et al. |
| 5,382,898 A | 1/1995 | Subramanian | 5,642,298 A | 6/1997 | Mallory et al. |
| 5,397,855 A | 3/1995 | Ferlier | 5,644,248 A | 7/1997 | Fujimoto |
| 5,404,111 A | 4/1995 | Mori et al. | 5,646,538 A | 7/1997 | Lide et al. |
| 5,408,188 A | 4/1995 | Katoh | 5,653,939 A | 8/1997 | Hollis et al. |
| 5,408,189 A | 4/1995 | Swart et al. | 5,656,942 A | 8/1997 | Watts et al. |
| 5,410,259 A | 4/1995 | Fujihara et al. | 5,657,394 A | 8/1997 | Schwartz et al. |
| 5,412,330 A | 5/1995 | Ravel et al. | 5,659,255 A | 8/1997 | Strid et al. |
| 5,412,866 A | 5/1995 | Woith et al. | 5,659,421 A | 8/1997 | Rahmel et al. |
| 5,414,565 A | 5/1995 | Sullivan et al. | 5,663,653 A | 9/1997 | Schwindt et al. |
| 5,422,574 A | 6/1995 | Kister | 5,666,063 A | 9/1997 | Abercrombie et al. |
| 5,434,512 A | 7/1995 | Schwindt et al. | 5,668,470 A | 9/1997 | Shelor |
| 5,448,172 A | 9/1995 | Dechene et al. | 5,669,316 A | 9/1997 | Faz et al. |
| 5,451,884 A | 9/1995 | Sauerland | 5,670,322 A | 9/1997 | Eggers et al. |
| 5,457,398 A | 10/1995 | Schwindt et al. | 5,670,888 A | 9/1997 | Cheng |
| 5,461,328 A | 10/1995 | Devereaux et al. | 5,672,816 A | 9/1997 | Park et al. |
| 5,467,024 A | 11/1995 | Swapp | 5,675,499 A | 10/1997 | Lee et al. |
| 5,469,324 A | 11/1995 | Henderson et al. | 5,675,932 A | 10/1997 | Mauney |
| 5,475,316 A | 12/1995 | Hurley et al. | 5,676,360 A | 10/1997 | Boucher et al. |
| 5,477,011 A | 12/1995 | Singles et al. | 5,680,039 A | 10/1997 | Mochizuki et al. |
| 5,478,748 A | 12/1995 | Akins, Jr. et al. | 5,682,337 A | 10/1997 | El-Fishawy et al. |
| 5,479,108 A | 12/1995 | Cheng | 5,685,232 A | 11/1997 | Inoue |
| 5,479,109 A | 12/1995 | Lau et al. | 5,704,355 A | 1/1998 | Bridges |
| 5,481,196 A | 1/1996 | Nosov | 5,712,571 A | 1/1998 | O'Donoghue |
| 5,481,936 A | 1/1996 | Yanagisawa | 5,715,819 A | 2/1998 | Svenson et al. |
| 5,486,975 A | 1/1996 | Shamouilian et al. | 5,729,150 A | 3/1998 | Schwindt |
| 5,488,954 A | 2/1996 | Sleva et al. | 5,731,708 A | 3/1998 | Sobhani |
| 5,491,426 A | 2/1996 | Small | 5,731,920 A | 3/1998 | Katsuragawa |
| 5,493,070 A | 2/1996 | Habu | 5,744,971 A | 4/1998 | Chan et al. |
| 5,493,236 A | 2/1996 | Ishii et al. | 5,748,506 A | 5/1998 | Bockelman |
| 5,500,606 A | 3/1996 | Holmes | 5,751,252 A | 5/1998 | Phillips |
| 5,505,150 A | 4/1996 | James et al. | 5,767,690 A | 6/1998 | Fujimoto |
| 5,506,498 A | 4/1996 | Anderson et al. | 5,773,951 A | 6/1998 | Markowski et al. |
| 5,506,515 A | 4/1996 | Godshalk et al. | 5,777,485 A | 7/1998 | Tanaka et al. |
| 5,508,631 A | 4/1996 | Manku et al. | 5,792,668 A | 8/1998 | Fuller et al. |
| 5,510,792 A | 4/1996 | Ono et al. | 5,793,213 A | 8/1998 | Bockelman et al. |
| 5,511,010 A | 4/1996 | Burns | 5,794,133 A | 8/1998 | Kashima |
| 5,512,835 A | 4/1996 | Rivera et al. | 5,798,652 A | 8/1998 | Taraci |
| 5,515,167 A | 5/1996 | Ledger et al. | 5,802,856 A | 9/1998 | Schaper et al. |
| 5,517,111 A | 5/1996 | Shelor | 5,804,982 A | 9/1998 | Lo et al. |
| 5,521,522 A | 5/1996 | Abe et al. | 5,804,983 A | 9/1998 | Nakajima et al. |
| 5,523,694 A | 6/1996 | Cole, Jr. | 5,807,107 A | 9/1998 | Bright et al. |
| 5,528,158 A | 6/1996 | Sinsheimer et al. | 5,811,751 A | 9/1998 | Leong et al. |
| 5,530,371 A | 6/1996 | Perry et al. | 5,824,494 A | 10/1998 | Feldberg |
| 5,530,372 A | 6/1996 | Lee et al. | 5,828,225 A | 10/1998 | Obikane et al. |
| 5,532,609 A | 7/1996 | Harwood et al. | 5,829,437 A | 11/1998 | Bridges |
| 5,539,323 A | 7/1996 | Davis, Jr. | 5,831,442 A | 11/1998 | Heigl |
| 5,539,676 A | 7/1996 | Yamaguchi | 5,833,601 A | 11/1998 | Swartz et al. |
| 5,546,012 A | 8/1996 | Perry et al. | 5,835,997 A | 11/1998 | Yassine |
| 5,550,480 A | 8/1996 | Nelson et al. | 5,838,161 A | 11/1998 | Akram et al. |
| 5,550,482 A | 8/1996 | Sano | 5,841,288 A | 11/1998 | Meaney et al. |
| 5,552,716 A | 9/1996 | Takahashi et al. | 5,846,708 A | 12/1998 | Hollis et al. |
| 5,554,236 A | 9/1996 | Singles et al. | 5,847,569 A | 12/1998 | Ho et al. |
| 5,561,377 A | 10/1996 | Strid et al. | 5,848,500 A | 12/1998 | Kirk |
| 5,561,585 A | 10/1996 | Barnes et al. | 5,852,232 A | 12/1998 | Samsavar et al. |
| 5,565,788 A | 10/1996 | Burr et al. | 5,854,608 A | 12/1998 | Leisten |
| 5,565,881 A | 10/1996 | Phillips et al. | 5,857,667 A | 1/1999 | Lee |
| 5,569,591 A | 10/1996 | Kell et al. | 5,861,743 A | 1/1999 | Pye et al. |
| 5,571,324 A | 11/1996 | Sago et al. | 5,867,073 A | 2/1999 | Weinreb et al. |
| 5,572,398 A | 11/1996 | Federlin et al. | 5,869,326 A | 2/1999 | Hofmann |
| 5,578,932 A | 11/1996 | Adamian | 5,869,975 A | 2/1999 | Strid et al. |
| 5,583,445 A | 12/1996 | Mullen | 5,874,361 A | 2/1999 | Collins et al. |
| 5,584,608 A | 12/1996 | Gillespie | 5,879,289 A | 3/1999 | Yarush et al. |
| 5,594,358 A | 1/1997 | Ishikawa et al. | 5,883,522 A | 3/1999 | O'Boyle |

| Patent | Date | Inventor |
|---|---|---|
| 5,883,523 A | 3/1999 | Ferland et al. |
| 5,888,075 A | 3/1999 | Hasegawa et al. |
| 5,892,539 A | 4/1999 | Colvin |
| 5,900,737 A | 5/1999 | Graham et al. |
| 5,903,143 A | 5/1999 | Mochizuki et al. |
| 5,905,421 A | 5/1999 | Oldfield |
| 5,910,727 A | 6/1999 | Fujihara et al. |
| 5,916,689 A | 6/1999 | Collins et al. |
| 5,923,177 A | 7/1999 | Wardwell |
| 5,926,028 A | 7/1999 | Mochizuki |
| 5,942,907 A | 8/1999 | Chiang |
| 5,944,093 A | 8/1999 | Viswanath |
| 5,945,836 A | 8/1999 | Sayre et al. |
| 5,949,383 A | 9/1999 | Hayes et al. |
| 5,949,579 A | 9/1999 | Baker |
| 5,952,842 A | 9/1999 | Fujimoto |
| 5,959,461 A | 9/1999 | Brown et al. |
| 5,960,411 A | 9/1999 | Hartman et al. |
| 5,963,027 A | 10/1999 | Peters |
| 5,963,364 A | 10/1999 | Leong et al. |
| 5,970,429 A | 10/1999 | Martin |
| 5,973,505 A | 10/1999 | Strid et al. |
| 5,974,662 A | 11/1999 | Eldridge et al. |
| 5,981,268 A | 11/1999 | Kovacs et al. |
| 5,982,166 A | 11/1999 | Mautz |
| 5,993,611 A | 11/1999 | Moroney, III et al. |
| 5,995,914 A | 11/1999 | Cabot |
| 5,996,102 A | 11/1999 | Haulin |
| 5,998,768 A | 12/1999 | Hunter et al. |
| 5,999,268 A | 12/1999 | Yonezawa et al. |
| 6,001,760 A | 12/1999 | Katsuda et al. |
| 6,002,236 A | 12/1999 | Trant et al. |
| 6,002,263 A | 12/1999 | Peters et al. |
| 6,002,426 A | 12/1999 | Back et al. |
| 6,013,586 A | 1/2000 | McGhee et al. |
| 6,019,612 A | 2/2000 | Hasegawa et al. |
| 6,023,209 A | 2/2000 | Faulkner et al. |
| 6,028,435 A | 2/2000 | Nikawa |
| 6,029,141 A | 2/2000 | Bezos et al. |
| 6,031,383 A | 2/2000 | Streib et al. |
| 6,032,714 A | 3/2000 | Fenton |
| 6,034,533 A | 3/2000 | Tervo et al. |
| 6,037,785 A | 3/2000 | Higgins |
| 6,037,793 A | 3/2000 | Miyazawa et al. |
| 6,043,667 A | 3/2000 | Cadwallader et al. |
| 6,043,668 A | 3/2000 | Carney |
| 6,049,216 A | 4/2000 | Yang et al. |
| 6,051,422 A | 4/2000 | Kovacs et al. |
| 6,052,653 A | 4/2000 | Mazur et al. |
| 6,054,869 A | 4/2000 | Hutton et al. |
| 6,060,888 A | 5/2000 | Blackham et al. |
| 6,060,891 A | 5/2000 | Hembree et al. |
| 6,060,892 A | 5/2000 | Yamagata |
| 6,061,589 A | 5/2000 | Bridges et al. |
| 6,064,213 A | 5/2000 | Khandros et al. |
| 6,064,217 A | 5/2000 | Smith |
| 6,064,218 A | 5/2000 | Godfrey et al. |
| 6,066,911 A | 5/2000 | Lindemann et al. |
| 6,078,183 A | 6/2000 | Cole, Jr. |
| 6,091,236 A | 7/2000 | Piety et al. |
| 6,091,255 A | 7/2000 | Godfrey |
| 6,096,567 A | 8/2000 | Kaplan et al. |
| 6,100,815 A | 8/2000 | Pailthorp |
| 6,104,203 A | 8/2000 | Costello et al. |
| 6,104,206 A | 8/2000 | Verkuil |
| 6,111,419 A | 8/2000 | Lefever et al. |
| 6,114,865 A | 9/2000 | Lagowski et al. |
| 6,118,287 A | 9/2000 | Boll et al. |
| 6,118,894 A | 9/2000 | Schwartz et al. |
| 6,121,783 A | 9/2000 | Horner et al. |
| 6,124,723 A | 9/2000 | Costello |
| 6,124,725 A | 9/2000 | Sato |
| 6,127,831 A | 10/2000 | Khoury et al. |
| 6,130,544 A | 10/2000 | Strid et al. |
| 6,137,302 A | 10/2000 | Schwindt |
| 6,137,303 A | 10/2000 | Deckert et al. |
| 6,144,212 A | 11/2000 | Mizuta |
| 6,147,502 A | 11/2000 | Fryer et al. |
| 6,147,851 A | 11/2000 | Anderson |
| 6,160,407 A | 12/2000 | Nikawa |
| 6,161,294 A | 12/2000 | Bland et al. |
| 6,166,553 A | 12/2000 | Sinsheimer |
| 6,169,410 B1 | 1/2001 | Grace et al. |
| 6,172,337 B1 | 1/2001 | Johnsgard et al. |
| 6,175,228 B1 | 1/2001 | Zamborelli et al. |
| 6,176,091 B1 | 1/2001 | Kishi et al. |
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,845 B1 | 2/2001 | Leisten et al. |
| 6,191,596 B1 | 2/2001 | Abiko |
| 6,194,720 B1 | 2/2001 | Li et al. |
| 6,194,907 B1 | 2/2001 | Kanao et al. |
| 6,198,299 B1 | 3/2001 | Hollman |
| 6,211,663 B1 | 4/2001 | Moulthrop et al. |
| 6,211,837 B1 | 4/2001 | Crouch et al. |
| 6,215,295 B1 | 4/2001 | Smith, III |
| 6,222,031 B1 | 4/2001 | Wakabayashi et al. |
| 6,222,970 B1 | 4/2001 | Wach et al. |
| 6,229,322 B1 | 5/2001 | Hembree |
| 6,229,327 B1 | 5/2001 | Boll et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,232,790 B1 | 5/2001 | Bryan et al. |
| 6,233,613 B1 | 5/2001 | Walker et al. |
| 6,236,221 B1 * | 5/2001 | Chabraya .................... 324/755 |
| 6,236,223 B1 | 5/2001 | Brady et al. |
| 6,236,975 B1 | 5/2001 | Boe et al. |
| 6,236,977 B1 | 5/2001 | Verba et al. |
| 6,242,929 B1 | 6/2001 | Mizuta |
| 6,245,692 B1 | 6/2001 | Pearce et al. |
| 6,251,595 B1 | 6/2001 | Gordon et al. |
| 6,252,392 B1 | 6/2001 | Peters |
| 6,257,319 B1 | 7/2001 | Kainuma et al. |
| 6,257,564 B1 | 7/2001 | Avneri et al. |
| 6,259,261 B1 | 7/2001 | Engelking et al. |
| 6,265,950 B1 | 7/2001 | Schmidt et al. |
| 6,271,673 B1 | 8/2001 | Furuta et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,284,971 B1 | 9/2001 | Atalar et al. |
| 6,288,557 B1 | 9/2001 | Peters et al. |
| 6,292,760 B1 | 9/2001 | Burns |
| 6,300,775 B1 | 10/2001 | Peach et al. |
| 6,307,672 B1 | 10/2001 | DeNure |
| 6,310,483 B1 | 10/2001 | Taura et al. |
| 6,310,755 B1 | 10/2001 | Kholodenko et al. |
| 6,313,567 B1 | 11/2001 | Maltabes et al. |
| 6,313,649 B2 | 11/2001 | Harwood et al. |
| 6,320,372 B1 | 11/2001 | Keller |
| 6,320,396 B1 | 11/2001 | Nikawa |
| 6,327,034 B1 | 12/2001 | Hoover et al. |
| 6,335,625 B1 | 1/2002 | Bryant et al. |
| 6,335,628 B1 | 1/2002 | Schwindt et al. |
| 6,340,568 B2 | 1/2002 | Hefti |
| 6,340,895 B1 | 1/2002 | Uher et al. |
| 6,359,456 B1 | 3/2002 | Hembree et al. |
| 6,362,636 B1 | 3/2002 | Peters et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |

| | | |
|---|---|---|
| 6,380,751 B2 | 4/2002 | Harwood et al. |
| 6,384,614 B1 | 5/2002 | Hager et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,560 B1 | 6/2002 | Walraven et al. |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,141 B1 | 7/2002 | Hollman et al. |
| 6,424,316 B1 | 7/2002 | Leisten et al. |
| 6,445,202 B1 | 9/2002 | Cowan et al. |
| 6,447,339 B1 | 9/2002 | Reed et al. |
| 6,448,788 B1 | 9/2002 | Meaney et al. |
| 6,459,739 B1 | 10/2002 | Vitenberg |
| 6,466,046 B1 | 10/2002 | Maruyama et al. |
| 6,468,816 B2 | 10/2002 | Hunter |
| 6,476,442 B1 | 11/2002 | Williams et al. |
| 6,480,013 B1 | 11/2002 | Nayler et al. |
| 6,481,939 B1 | 11/2002 | Gillespie et al. |
| 6,483,327 B1 | 11/2002 | Bruce et al. |
| 6,483,336 B1 | 11/2002 | Harris et al. |
| 6,486,687 B2 | 11/2002 | Harwood et al. |
| 6,488,405 B1 | 12/2002 | Eppes et al. |
| 6,489,789 B2 | 12/2002 | Peters et al. |
| 6,490,471 B2 | 12/2002 | Svenson et al. |
| 6,492,822 B2 | 12/2002 | Schwindt et al. |
| 6,501,289 B1 | 12/2002 | Takekoshi |
| 6,512,391 B2 | 1/2003 | Cowan et al. |
| 6,512,482 B1 | 1/2003 | Nelson et al. |
| 6,515,494 B1 | 2/2003 | Low |
| 6,528,993 B1 | 3/2003 | Shin et al. |
| 6,529,844 B1 | 3/2003 | Kapetanic et al. |
| 6,548,311 B1 | 4/2003 | Knoll |
| 6,549,022 B1 | 4/2003 | Cole, Jr. et al. |
| 6,549,026 B1 | 4/2003 | DiBattista et al. |
| 6,549,106 B2 | 4/2003 | Martin |
| 6,566,079 B2 | 5/2003 | Hefti |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,603,322 B1 | 8/2003 | Boll et al. |
| 6,605,951 B1 | 8/2003 | Cowan |
| 6,605,955 B1 | 8/2003 | Costello et al. |
| 6,608,494 B1 | 8/2003 | Bruce et al. |
| 6,608,496 B1 | 8/2003 | Strid et al. |
| 6,611,417 B2 | 8/2003 | Chen |
| 6,617,862 B1 | 9/2003 | Bruce |
| 6,621,082 B2 | 9/2003 | Morita et al. |
| 6,624,891 B2 | 9/2003 | Marcus et al. |
| 6,627,461 B2 | 9/2003 | Chapman et al. |
| 6,628,503 B2 | 9/2003 | Sogard |
| 6,628,980 B2 | 9/2003 | Atalar et al. |
| 6,633,174 B1 | 10/2003 | Satya et al. |
| 6,636,059 B2 | 10/2003 | Harwood et al. |
| 6,636,182 B2 | 10/2003 | Mehltretter |
| 6,639,415 B2 | 10/2003 | Peters et al. |
| 6,639,461 B1 | 10/2003 | Tam et al. |
| 6,642,732 B2 | 11/2003 | Cowan et al. |
| 6,643,597 B1 | 11/2003 | Dunsmore |
| 6,650,135 B1 | 11/2003 | Mautz et al. |
| 6,653,903 B2 | 11/2003 | Leich et al. |
| 6,657,214 B1 | 12/2003 | Foegelle et al. |
| 6,657,601 B2 | 12/2003 | McLean |
| 6,686,753 B1 | 2/2004 | Kitahata |
| 6,701,265 B2 | 3/2004 | Hill et al. |
| 6,707,548 B2 | 3/2004 | Kreimer et al. |
| 6,710,798 B1 | 3/2004 | Hershel et al. |
| 6,717,426 B2 | 4/2004 | Iwasaki |
| 6,720,782 B2 | 4/2004 | Schwindt et al. |
| 6,724,205 B1 | 4/2004 | Hayden et al. |
| 6,724,928 B1 | 4/2004 | Davis |
| 6,727,716 B1 | 4/2004 | Sharif |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,739,208 B2 | 5/2004 | Hyakudomi |
| 6,744,268 B2 | 6/2004 | Hollman |
| 6,753,679 B1 | 6/2004 | Kwong et al. |
| 6,753,699 B2 | 6/2004 | Stockstad |
| 6,756,751 B2 | 6/2004 | Hunter |
| 6,768,328 B2 | 7/2004 | Self et al. |
| 6,770,955 B1 | 8/2004 | Coccioli et al. |
| 6,771,090 B2 | 8/2004 | Harris et al. |
| 6,771,806 B1 | 8/2004 | Satya et al. |
| 6,774,651 B1 | 8/2004 | Hembree |
| 6,777,964 B2 | 8/2004 | Navratil et al. |
| 6,778,140 B1 | 8/2004 | Yeh |
| 6,784,679 B2 | 8/2004 | Sweet et al. |
| 6,788,093 B2 | 9/2004 | Aitren et al. |
| 6,791,344 B2 | 9/2004 | Cook et al. |
| 6,794,888 B2 | 9/2004 | Kawaguchi et al. |
| 6,794,950 B2 | 9/2004 | du Toit et al. |
| 6,798,226 B2 | 9/2004 | Altmann et al. |
| 6,801,047 B2 | 10/2004 | Harwood et al. |
| 6,806,724 B2 | 10/2004 | Hayden et al. |
| 6,806,836 B2 | 10/2004 | Ogawa et al. |
| 6,809,533 B1 | 10/2004 | Anlage et al. |
| 6,812,718 B1 | 11/2004 | Chong et al. |
| 6,822,463 B1 | 11/2004 | Jacobs |
| 6,836,135 B2 | 12/2004 | Harris et al. |
| 6,838,885 B2 | 1/2005 | Kamitani |
| 6,842,024 B2 | 1/2005 | Peters et al. |
| 6,843,024 B2 | 1/2005 | Nozaki et al. |
| 6,847,219 B1 | 1/2005 | Lesher et al. |
| 6,856,129 B2 | 2/2005 | Thomas et al. |
| 6,861,856 B2 | 3/2005 | Dunklee et al. |
| 6,864,694 B2 | 3/2005 | McTigue |
| 6,873,167 B2 | 3/2005 | Goto et al. |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,914,244 B2 | 7/2005 | Alani |
| 6,914,580 B2 | 7/2005 | Leisten |
| 6,924,656 B2 | 8/2005 | Matsumoto |
| 6,927,079 B1 | 8/2005 | Fyfield |
| 6,937,341 B1 | 8/2005 | Woollam et al. |
| 6,965,226 B2 | 11/2005 | Dunklee |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |

| | | | | | | |
|---|---|---|---|---|---|---|
| 7,012,441 | B2 | 3/2006 | Chou et al. | 2002/0118034 A1 | 8/2002 | Laureanti |
| 7,013,221 | B1 | 3/2006 | Friend et al. | 2002/0149377 A1 | 10/2002 | Hefti et al. |
| 7,014,499 | B2 | 3/2006 | Yoon | 2002/0153909 A1 | 10/2002 | Petersen et al. |
| 7,015,455 | B2 | 3/2006 | Mitsuoka et al. | 2002/0163769 A1 | 11/2002 | Brown |
| 7,015,689 | B2 | 3/2006 | Kasajima et al. | 2002/0168659 A1 | 11/2002 | Hefti et al. |
| 7,015,690 | B2 | 3/2006 | Wang et al. | 2002/0180466 A1 | 12/2002 | Hiramatsu et al. |
| 7,015,703 | B2 | 3/2006 | Hopkins et al. | 2002/0197709 A1 | 12/2002 | Van der Weide et al. |
| 7,015,707 | B2 | 3/2006 | Cherian | 2003/0010877 A1 | 1/2003 | Landreville et al. |
| 7,015,708 | B2 | 3/2006 | Beckous et al. | 2003/0030822 A1 | 2/2003 | Finarov |
| 7,015,709 | B2 | 3/2006 | Capps et al. | 2003/0032000 A1 | 2/2003 | Liu et al. |
| 7,015,710 | B2 | 3/2006 | Yoshida et al. | 2003/0040004 A1 | 2/2003 | Hefti et al. |
| 7,015,711 | B2 | 3/2006 | Rothaug et al. | 2003/0057513 A1 | 4/2003 | Alexander |
| 7,019,541 | B2 | 3/2006 | Kittrell | 2003/0062915 A1 | 4/2003 | Arnold et al. |
| 7,019,544 | B1 | 3/2006 | Jacobs et al. | 2003/0071631 A1 | 4/2003 | Alexander |
| 7,019,701 | B2 | 3/2006 | Ohno et al. | 2003/0072549 A1 | 4/2003 | Facer et al. |
| 7,020,360 | B2 | 3/2006 | Satomura et al. | 2003/0077649 A1 | 4/2003 | Cho et al. |
| 7,020,363 | B2 | 3/2006 | Johannessen | 2003/0088180 A1 | 5/2003 | VanVeen et al. |
| 7,022,976 | B1 | 4/2006 | Santana, Jr. et al. | 2003/0119057 A1 | 6/2003 | Gascoyne et al. |
| 7,022,985 | B2 | 4/2006 | Knebel et al. | 2003/0139662 A1 | 7/2003 | Seidman |
| 7,023,225 | B2 | 4/2006 | Blackwood | 2003/0139790 A1 | 7/2003 | Ingle et al. |
| 7,023,226 | B2 | 4/2006 | Okumura et al. | 2003/0141861 A1 | 7/2003 | Navratil et al. |
| 7,023,229 | B2 | 4/2006 | Maesaki et al. | 2003/0155939 A1 | 8/2003 | Lutz et al. |
| 7,023,231 | B2 | 4/2006 | Howland, Jr. et al. | 2003/0156270 A1 | 8/2003 | Hunter |
| 7,025,628 | B2 | 4/2006 | LaMeres et al. | 2003/0170898 A1 | 9/2003 | Gundersen et al. |
| 7,026,832 | B2 | 4/2006 | Chaya et al. | 2003/0184332 A1 | 10/2003 | Tomimatsu et al. |
| 7,026,833 | B2 | 4/2006 | Rincon et al. | 2004/0015060 A1 | 1/2004 | Samsoondar et al. |
| 7,026,834 | B2 | 4/2006 | Hwang | 2004/0021475 A1 | 2/2004 | Ito et al. |
| 7,026,835 | B2 | 4/2006 | Farnworth et al. | 2004/0061514 A1 | 4/2004 | Schwindt et al. |
| 7,030,599 | B2 | 4/2006 | Douglas | 2004/0066181 A1 | 4/2004 | Thies |
| 7,030,827 | B2 | 4/2006 | Mahler et al. | 2004/0069776 A1 | 4/2004 | Fagrell et al. |
| 7,032,307 | B2 | 4/2006 | Matsunaga et al. | 2004/0090223 A1 | 5/2004 | Yonezawa |
| 7,034,553 | B2 | 4/2006 | Gilboe | 2004/0095145 A1 | 5/2004 | Boudiaf et al. |
| 7,035,738 | B2 | 4/2006 | Matsumoto et al. | 2004/0095641 A1 | 5/2004 | Russum et al. |
| 7,088,981 | B2 | 8/2006 | Chang | 2004/0100276 A1 | 5/2004 | Fanton |
| 7,096,133 | B1 | 8/2006 | Martin et al. | 2004/0100297 A1 | 5/2004 | Tanioka et al. |
| 7,101,797 | B2 | 9/2006 | Yuasa | 2004/0108847 A1 | 6/2004 | Stoll et al. |
| 7,138,813 | B2 | 11/2006 | Cowan et al. | 2004/0113639 A1 | 6/2004 | Dunklee et al. |
| 7,187,188 | B2 | 3/2007 | Andrews et al. | 2004/0113640 A1 | 6/2004 | Cooper et al. |
| 7,188,037 | B2 | 3/2007 | Hidehira | 2004/0130787 A1 | 7/2004 | Thome-Forster et al. |
| 7,221,172 | B2 | 5/2007 | Dunklee | 2004/0132222 A1 | 7/2004 | Hembree et al. |
| 7,250,779 | B2 | 7/2007 | Dunklee et al. | 2004/0134899 A1 | 7/2004 | Hiramatsu et al. |
| 7,352,168 | B2 | 4/2008 | Dunklee | 2004/0147034 A1 | 7/2004 | Gore et al. |
| 7,362,115 | B2 | 4/2008 | Andrews et al. | 2004/0162689 A1 | 8/2004 | Jamneala et al. |
| 7,423,419 | B2 | 9/2008 | Dunklee | 2004/0175294 A1 | 9/2004 | Ellison et al. |
| 7,501,810 | B2 | 3/2009 | Dunklee | 2004/0186382 A1 | 9/2004 | Modell et al. |
| 7,514,915 | B2 | 4/2009 | Dunklee | 2004/0193382 A1 | 9/2004 | Adamian et al. |
| 7,518,358 | B2 | 4/2009 | Dunklee | 2004/0197771 A1 | 10/2004 | Powers et al. |
| 7,554,322 | B2 | 6/2009 | Nordgren et al. | 2004/0199350 A1 | 10/2004 | Blackham et al. |
| 7,589,518 | B2 | 9/2009 | Schwindt et al. | 2004/0207072 A1 | 10/2004 | Hiramatsu et al. |
| 7,595,632 | B2 | 9/2009 | Harwood et al. | 2004/0207424 A1 | 10/2004 | Hollman |
| 2001/0002794 | A1 | 6/2001 | Draving et al. | 2004/0239338 A1 | 12/2004 | Johnsson et al. |
| 2001/0009377 | A1 | 7/2001 | Schwindt et al. | 2004/0246004 A1 | 12/2004 | Heuermann |
| 2001/0010468 | A1 | 8/2001 | Gleason et al. | 2004/0251922 A1 | 12/2004 | Martens et al. |
| 2001/0020283 | A1 | 9/2001 | Sakaguchi | 2004/0267691 A1 | 12/2004 | Vasudeva |
| 2001/0024116 | A1 | 9/2001 | Draving | 2005/0024069 A1 | 2/2005 | Hayden et al. |
| 2001/0030549 | A1 | 10/2001 | Gleason et al. | 2005/0026276 A1 | 2/2005 | Chou |
| 2001/0043073 | A1 | 11/2001 | Montoya | 2005/0030047 A1 | 2/2005 | Adamian |
| 2001/0044152 | A1 | 11/2001 | Burnett | 2005/0054029 A1 | 3/2005 | Tomimatsu et al. |
| 2001/0045511 | A1 | 11/2001 | Moore et al. | 2005/0062533 A1 | 3/2005 | Vice |
| 2001/0054906 | A1 | 12/2001 | Fujimura | 2005/0083130 A1 | 4/2005 | Grilo |
| 2002/0005728 | A1 | 1/2002 | Babson et al. | 2005/0099192 A1 | 5/2005 | Dunklee et al. |
| 2002/0008533 | A1 | 1/2002 | Ito et al. | 2005/0101846 A1 | 5/2005 | Fine et al. |
| 2002/0009377 | A1 | 1/2002 | Shafer | 2005/0156675 A1 | 7/2005 | Rohde et al. |
| 2002/0009378 | A1 | 1/2002 | Obara | 2005/0164160 A1 | 7/2005 | Gunter et al. |
| 2002/0011859 | A1 | 1/2002 | Smith et al. | 2005/0165316 A1 | 7/2005 | Lowery et al. |
| 2002/0011863 | A1 | 1/2002 | Takahashi et al. | 2005/0168722 A1 | 8/2005 | Forstner et al. |
| 2002/0050828 | A1 | 5/2002 | Seward, IV et al. | 2005/0174191 A1 | 8/2005 | Brunker et al. |
| 2002/0066551 | A1 | 6/2002 | Stone et al. | 2005/0178980 A1 | 8/2005 | Skidmore et al. |
| 2002/0070743 | A1 | 6/2002 | Felici et al. | 2005/0195124 A1 | 9/2005 | Puente Baliarda et al. |
| 2002/0070745 | A1 | 6/2002 | Johnson et al. | 2005/0227503 A1 | 10/2005 | Reitinger |
| 2002/0075027 | A1 | 6/2002 | Hollman et al. | 2005/0236587 A1 | 10/2005 | Kodama et al. |
| 2002/0079911 | A1 | 6/2002 | Schwindt | 2005/0237102 A1 | 10/2005 | Tanaka |
| 2002/0118009 | A1 | 8/2002 | Hollman et al. | 2006/0052075 A1 | 3/2006 | Galivanche et al. |

| | | |
|---|---|---|
| 2006/0114012 A1 | 6/2006 | Reitinger |
| 2006/0155270 A1 | 7/2006 | Hancock et al. |
| 2006/0158207 A1 | 7/2006 | Reitinger |
| 2006/0226864 A1 | 10/2006 | Kramer |
| 2007/0024506 A1 | 2/2007 | Hardacker |
| 2007/0030021 A1 | 2/2007 | Cowan et al. |

FOREIGN PATENT DOCUMENTS

| | | |
|---|---|---|
| DE | 31 14 466 | 3/1982 |
| DE | 31 25 552 | 11/1982 |
| DE | 36 37 549 | 5/1988 |
| DE | 41 09 908 | 10/1992 |
| DE | 43 16 111 | 11/1994 |
| DE | 94 06 227 | 10/1995 |
| DE | 195 41 334 | 9/1996 |
| DE | 196 16 212 | 10/1996 |
| DE | 195 22 774 | 1/1997 |
| DE | 196 18 717 | 1/1998 |
| DE | 693 22 206 | 4/1999 |
| DE | 100 00 324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 | 5/1993 |
| EP | 0 706 210 | 4/1996 |
| EP | 0 505 981 | 6/1998 |
| EP | 0 573 183 | 1/1999 |
| EP | 0 945 736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-11243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-082631 | 4/1993 |
| JP | 5-157790 | 6/1993 |
| JP | 5-166893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-12871 | 1/1995 |
| JP | 8-35987 | 2/1996 |
| JP | 8-261898 | 10/1996 |
| JP | 8-330401 | 12/1996 |
| JP | 10-116866 | 5/1998 |
| JP | 11-023975 | 1/1999 |
| JP | 11-031724 | 2/1999 |
| JP | 2000-329664 | 11/2000 |
| JP | 2001-189285 | 7/2001 |
| JP | 2001-189378 | 7/2001 |
| JP | 2001-858184 | 12/2001 |
| JP | 2002-033374 | 1/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics." Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions on Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18$^{th}$ Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Signatone S-1240 Thermal Controller, 2 page description.

The Micromanipulator Company, "Semi-Automatic Probing Stations and Accessories," pp. 1-12.

Integrated Technology Corporation, "Probilt PB500A Probe Card Repair and Analysis Station," 4 pages.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Temptronic Corporation, "Model TPO3000 Series ThermoChuck Systems for Probing, Characterization and Failure analysis of Wafers, Chips and Hybrids at High and Low Temperatures," pp. 2-5.

Cascade Microtech, "Model 42/42D Microwave Probe Station Instruction Manual, Electrical Operation," pp. 4-1-4-42.

Inter-Continental Microwave, "Microwave Semiconductor Chip Measurements using the HP 8510B TRL-Calibration Technique," Application Note: 101.

Design Technique, "Microstrip Microwave Test Fixture," May 1986, 2 pages.

Photo: Micromanipulator Probe Station 1994.

Micromanipulator Sales and Services Inc., "Test Station Accessories," Copyright 1983, 1984, 1 page.

Keithley Instruments, Inc. "Low-Level Measurements for Effective Low Current, Low Voltage, and High Impedance Measurements," Revised Third Edition, Printed Jun. 1984.

Inter-Continental Microwave, 2370-B Walsh Avenue, Santa Clara, CA 95051, "Product Catalog,".

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R.Y. Koyama & M. G. Buehler, "Semiconductor Measurement Technology: A Wafer Chuck for Use Between—196 and 350° C," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 pages, 8505 SE 68$^{th}$ Street, Mercer Island, Washington 98040.

Saswata Basu & Reed Gleason, "A Membrane Quadrant Probe for R&D Applications," Cascade Microtech, Inc. 14255 SW Brigadoon Ct., Beaverton, OR 97005, 3 pages.

The Micromanipulator Company, Inc., "Model 8000 Test Station," 1986, 1 page.

The Micromanipulator Company, Inc. "Model 8000 Test Station," 1988, 1 page.

"Vacuum," Mechanical Operation, pp. 3-8-3-9.

The Micromanipulator Company, Inc., "Accessories: Hot and Hot/Cold Chucks, Integrated Dry environments, Triaxial chucks, Integrated Shielded and Dark environments, Probe Card Holders," p. 8.

Microwave Products, Microwave Journal, Sep. 1988, 1 page.

Cascade Microtech, "Advanced On-Wafer Device Characterization Using the Summit 10500," pp. 2-20.

Hewlett Packard, "HP 4142B Modular DC source/Monitor Practical Applications—High Speed DC Characterization of Semiconductor Devices from Sub pA to 1A," Nov. 1987, pp. 1-4.

Doug Rytting, "Appendix to an Analysis of Vector Measurement Accuracy Enhancement Techniques," pp. 1-42, Hewlett Packard.

Temptronic Corporation, "Application Note 1 Controlled Environment Enclosure for low temperature wafer probing in a moisture-free environment," 2 pages.

*Cascade Microtech, Inc.* vs. *Micromanipulator Company, Inc.*, "Deposition of Harry F. Applebay," United States District Court for the District of Oregon, Lead Case No. 97-479-Al.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998. 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

\* cited by examiner

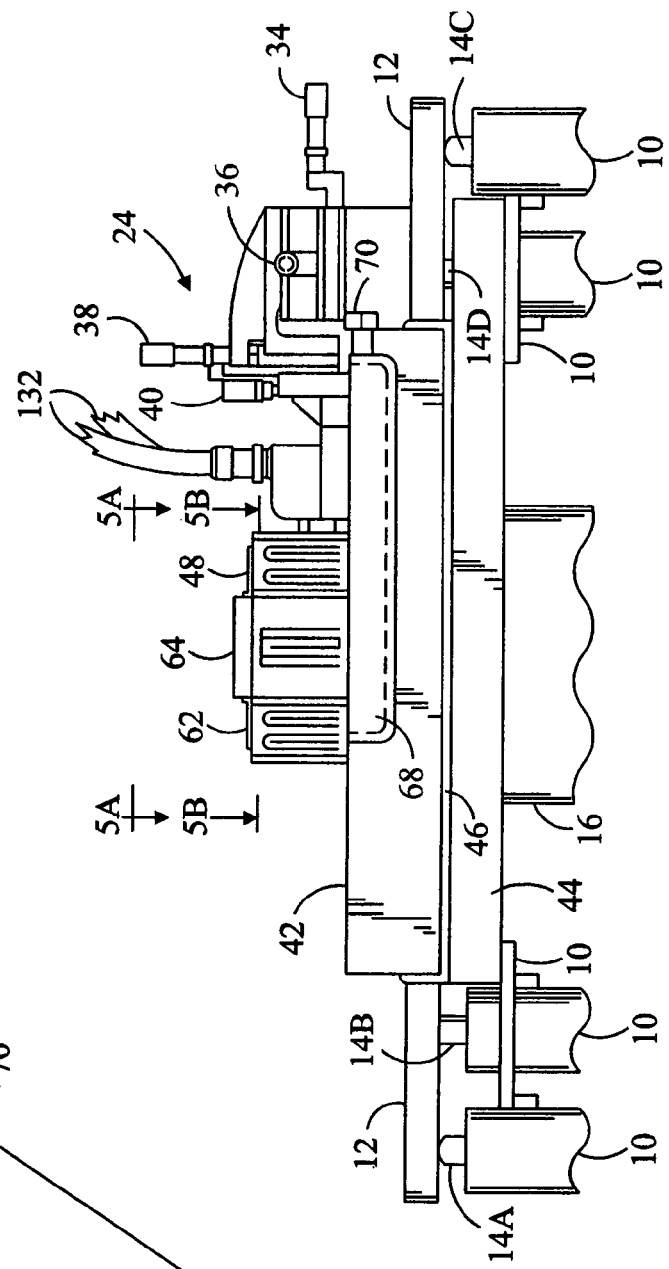
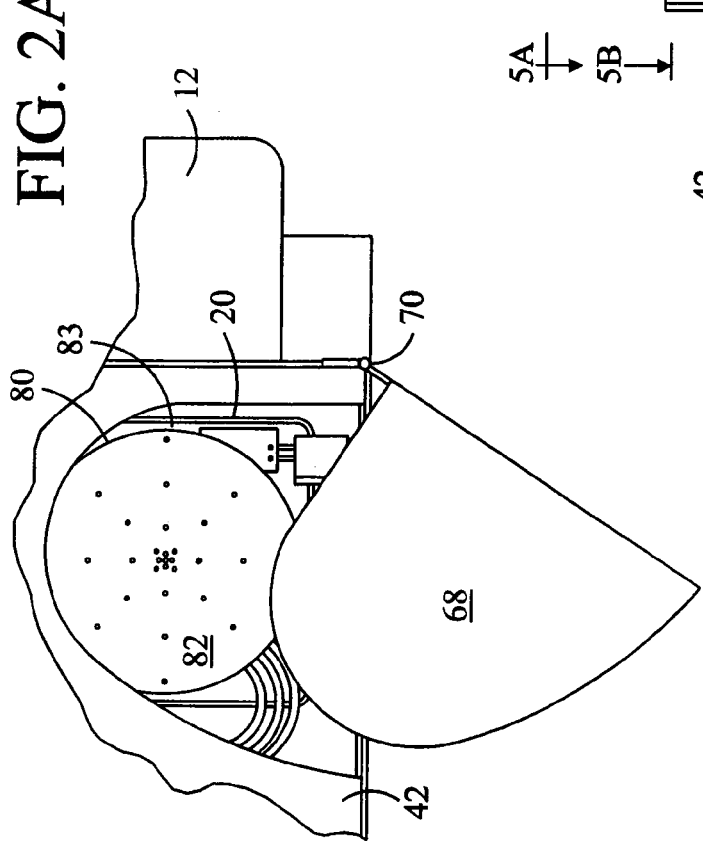
FIG. 2A
FIG. 1

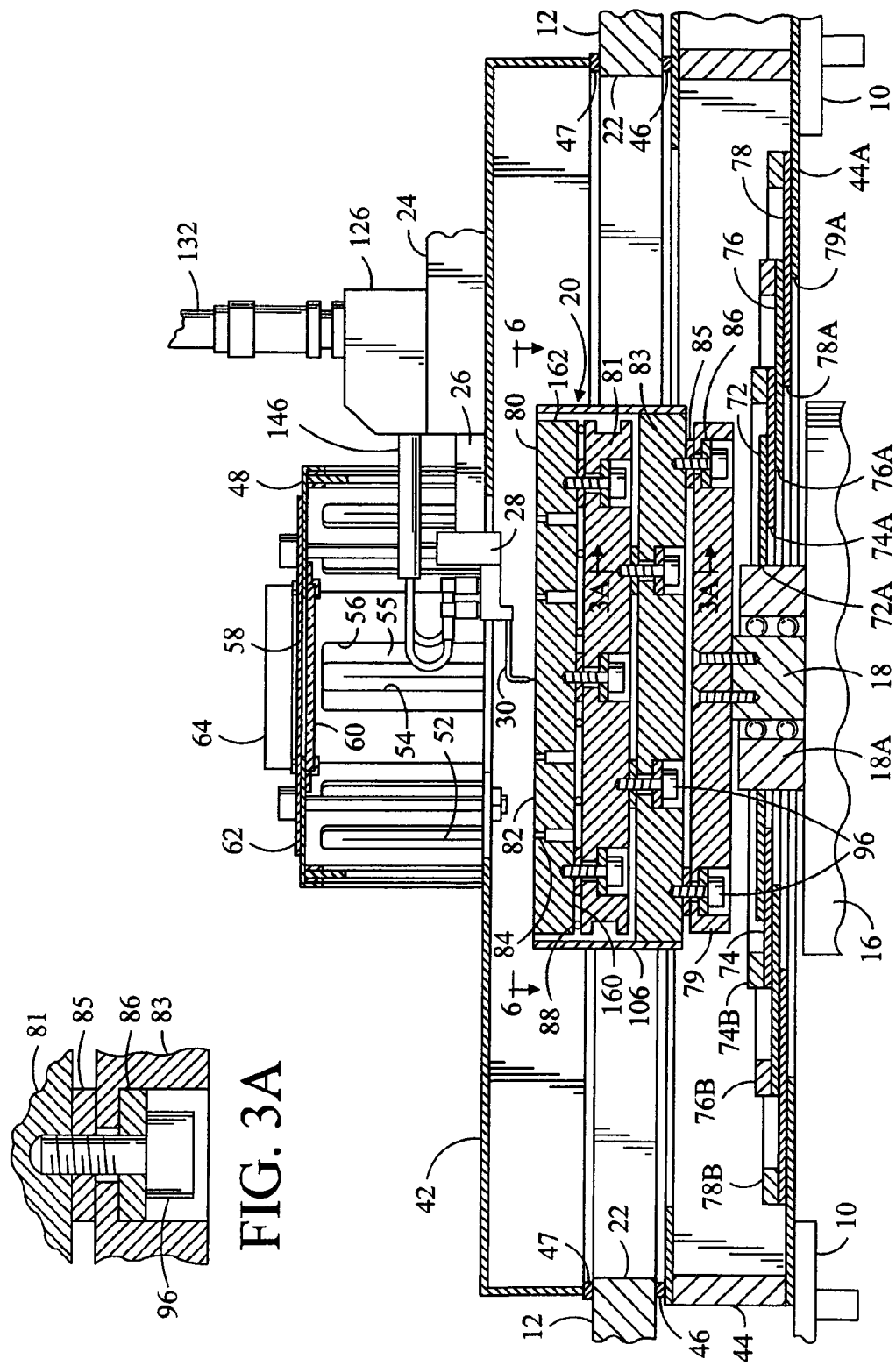

1

CHUCK FOR HOLDING A DEVICE UNDER TEST

CROSS-REFERENCE TO RELATED APPLICATIONS

This application is a Continuation of U.S. patent application Ser. No. 10/829,869, filed Apr. 21, 2004, now U.S. Pat No. 7,492,172; which claims the benefit of U.S. Provisional App. No. 60/473,232, filed May 23, 2003.

BACKGROUND OF THE INVENTION

The present application relates to an improved chuck.

With reference to FIGS. 1, 2 and 3, a probe station comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e. horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing. The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

With particular reference to FIGS. 3, 6 and 7, the chuck assembly 20 is a modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably the spacers and washers 85 and 86, respectively, are constructed of a material having the lowest possible dielectric constant consistent with high dimensional stability and high volume resistivity. A suitable material for the spacers and washers is glass epoxy, or acetal homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108a, 108b and 118a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110b are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 10, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b. U.S. Pat. No. 5,532,609 discloses a probe station and chuck and is hereby incorporated by reference.

The chuck assembly 20 with corresponding vertical apertures 84 and respective chambers separated by O-rings 88 permits selectively creating a vacuum within three different zones. Including the three O-rings 88 and the dielectric spacers 85 surrounding the metallic screws 96 permits securing adjacent first, second and third chuck assembly elements 80, 81 and 83 together. The concentric O-rings 88 are squeezed by the first and second chuck assembly elements and assist in distributing the force across the upper surface of the chuck assembly 20 to maintain a flat surface. However, the O-rings and dielectric spacers 85 have a greater dielectric constant than the surrounding air resulting in leakage currents. Also, the additional material between adjoining chuck assembly elements 80, 81, and 83 decreases the capacitance between the adjoining chuck assembly elements. Moreover, the dielectric material of the O-rings and dielectric spacers 85 builds up a charge therein during testing which increases the dielectric absorption. The O-rings and dielectric spacers 85 provides mechanical stability against warping the chuck when a wafer thereon is probed so that thinner chuck assembly elements 80, 81, and 83 may be used. The height of the different O-rings and dielectric spacers 85 tend to be slightly different which introduces non-planarity in the upper surface when the first, second, and third chuck assembly elements 80, 81, and 83 are secured together.

BRIEF DESCRIPTION OF THE DRAWINGS

FIG. 1 is a partial front view of an exemplary embodiment of a wafer probe station constructed in accordance with the present invention.

FIG. 2A is a top view of the wafer probe station of FIG. 1.

FIG. 3A is a partially sectional and partially schematic front view of the probe station of FIG. 1.

FIG. 3 is an enlarged sectional view taken along line 3A-3A of FIG. 3.

DETAILED DESCRIPTION OF THE PREFERRED EMBODIMENT

Figure 2B:
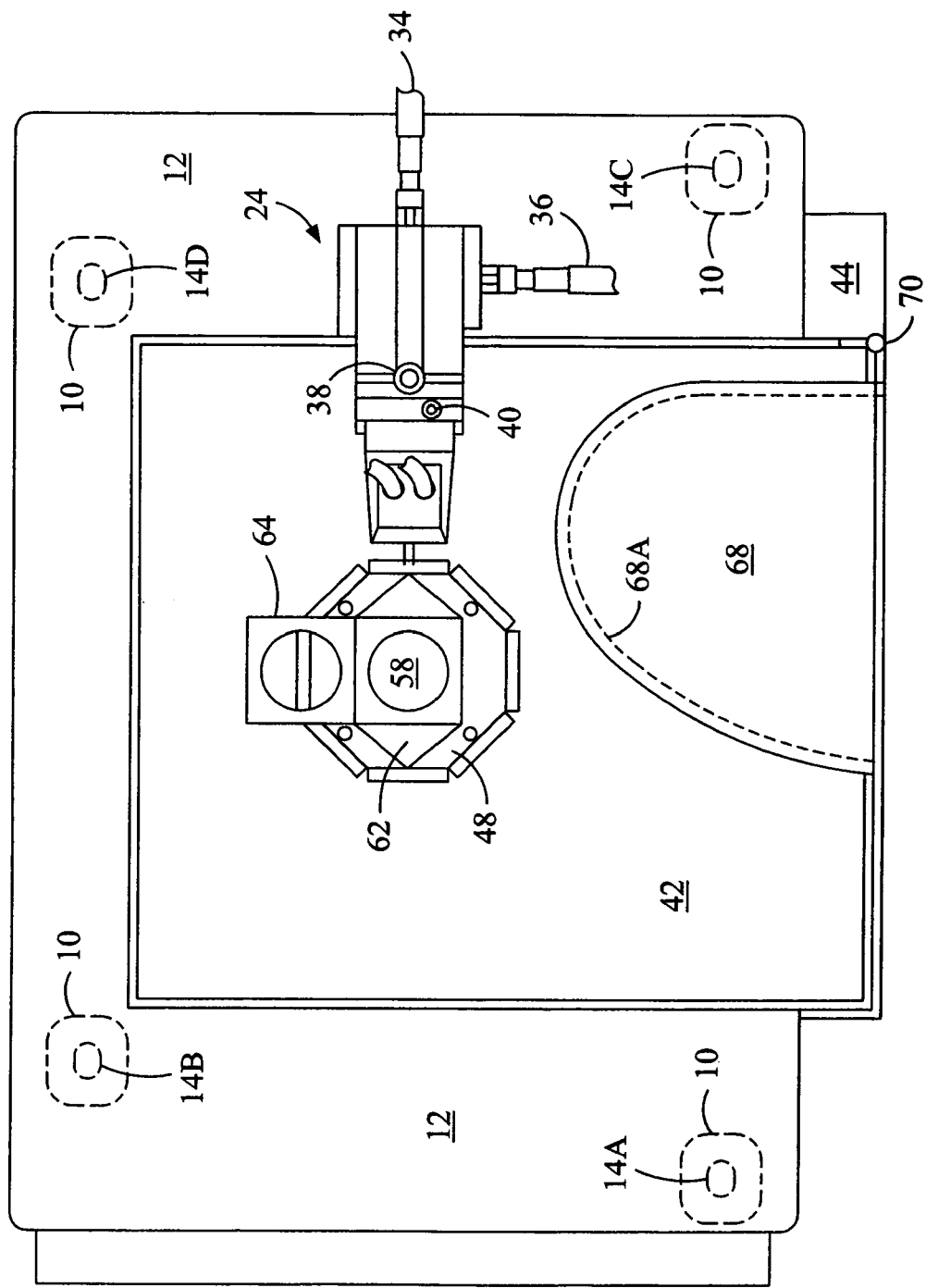
FIG. 2B is a partial top view of the wafer probe station of FIG. 1 with the enclosure door shown partially open.
Figure 4:
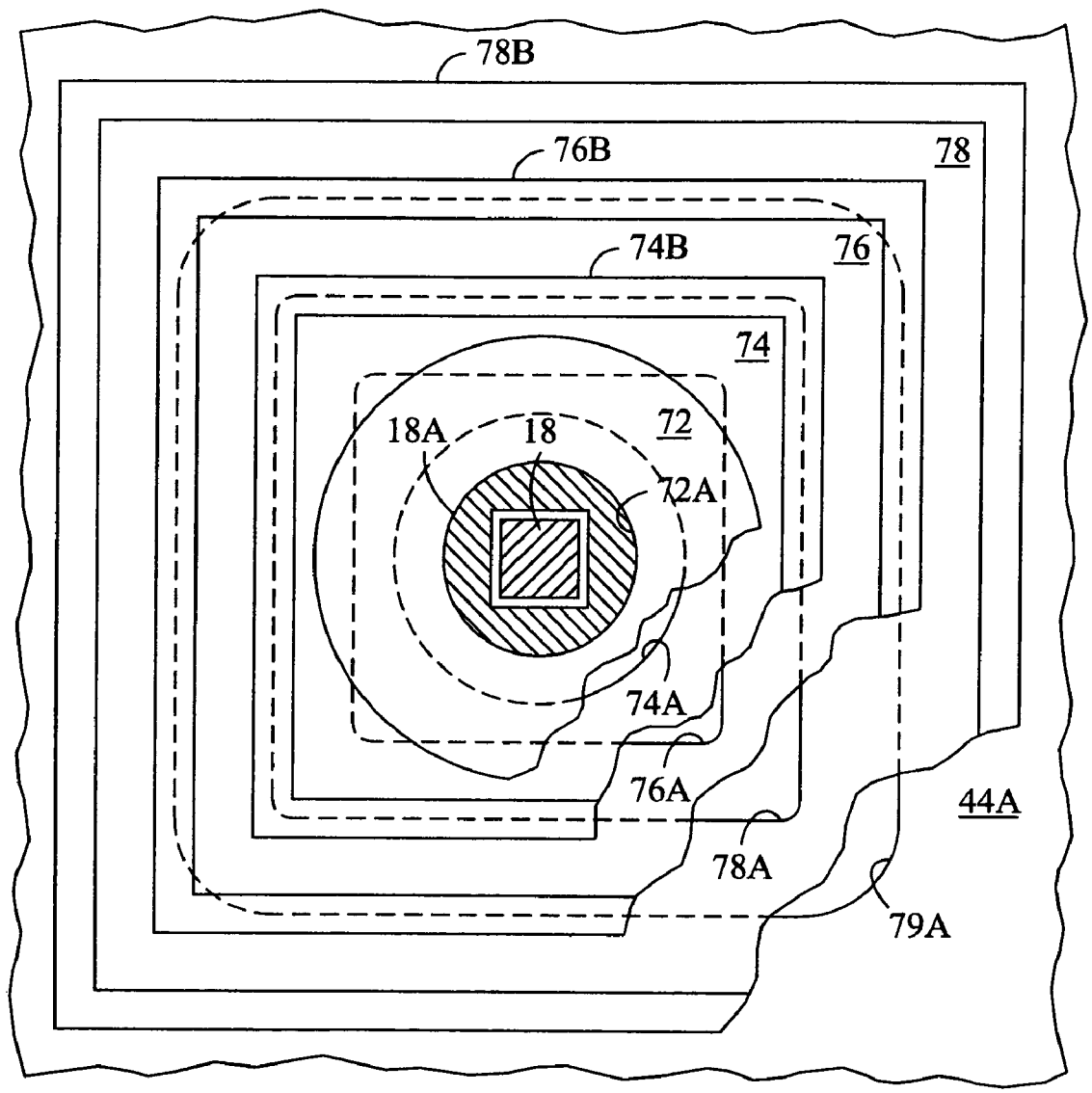
FIG. 4 is a top view of the sealing assembly where the motorized positioning mechanism extends through the bottom of the enclosure.
Figure 5A:
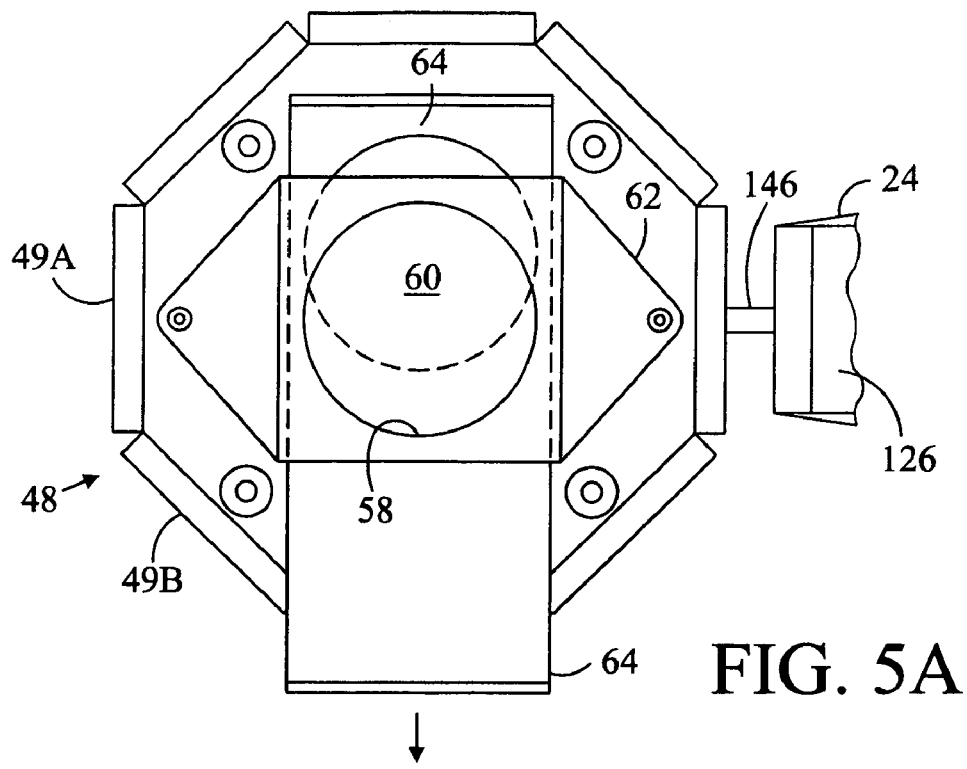
FIG. 5A is an enlarged top detail view taken along line 5A-5A of FIG. 1.
Figure 5B:
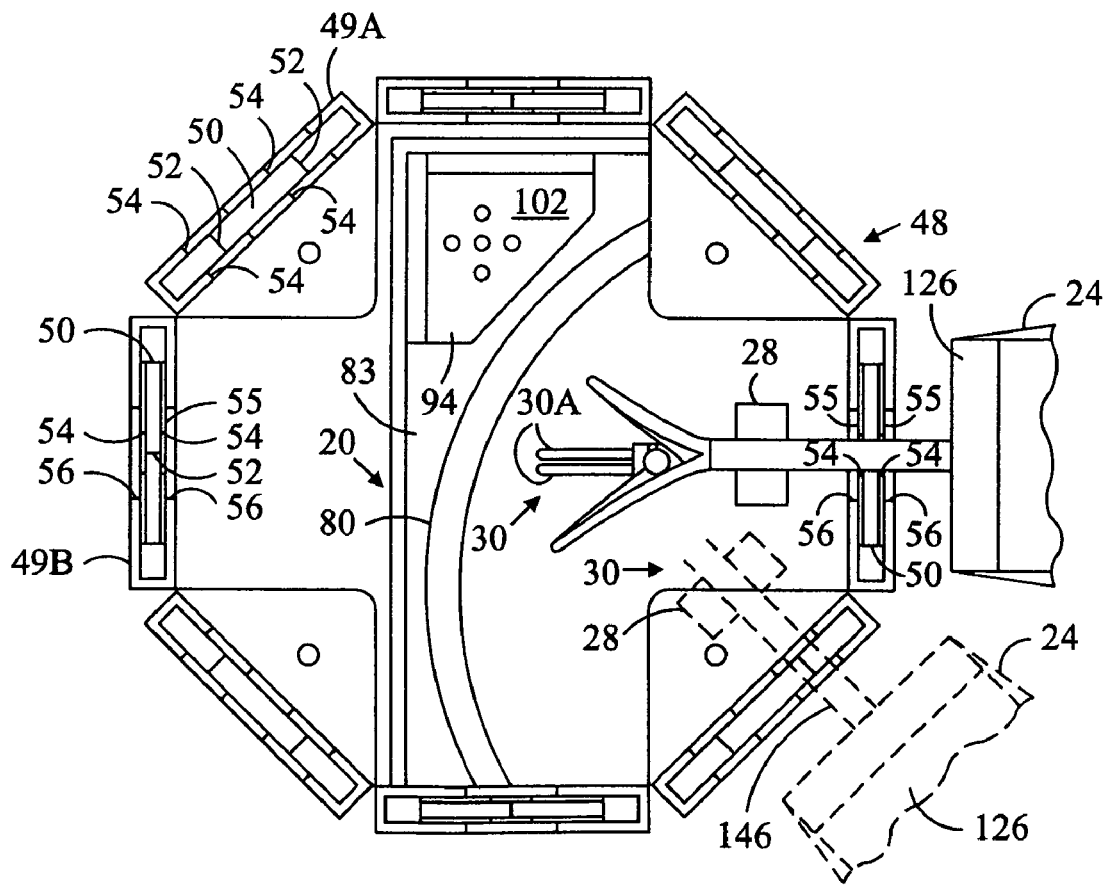
FIG. 5B is an enlarged top sectional view taken along line 5B-5B of FIG. 1.
Figure 6:
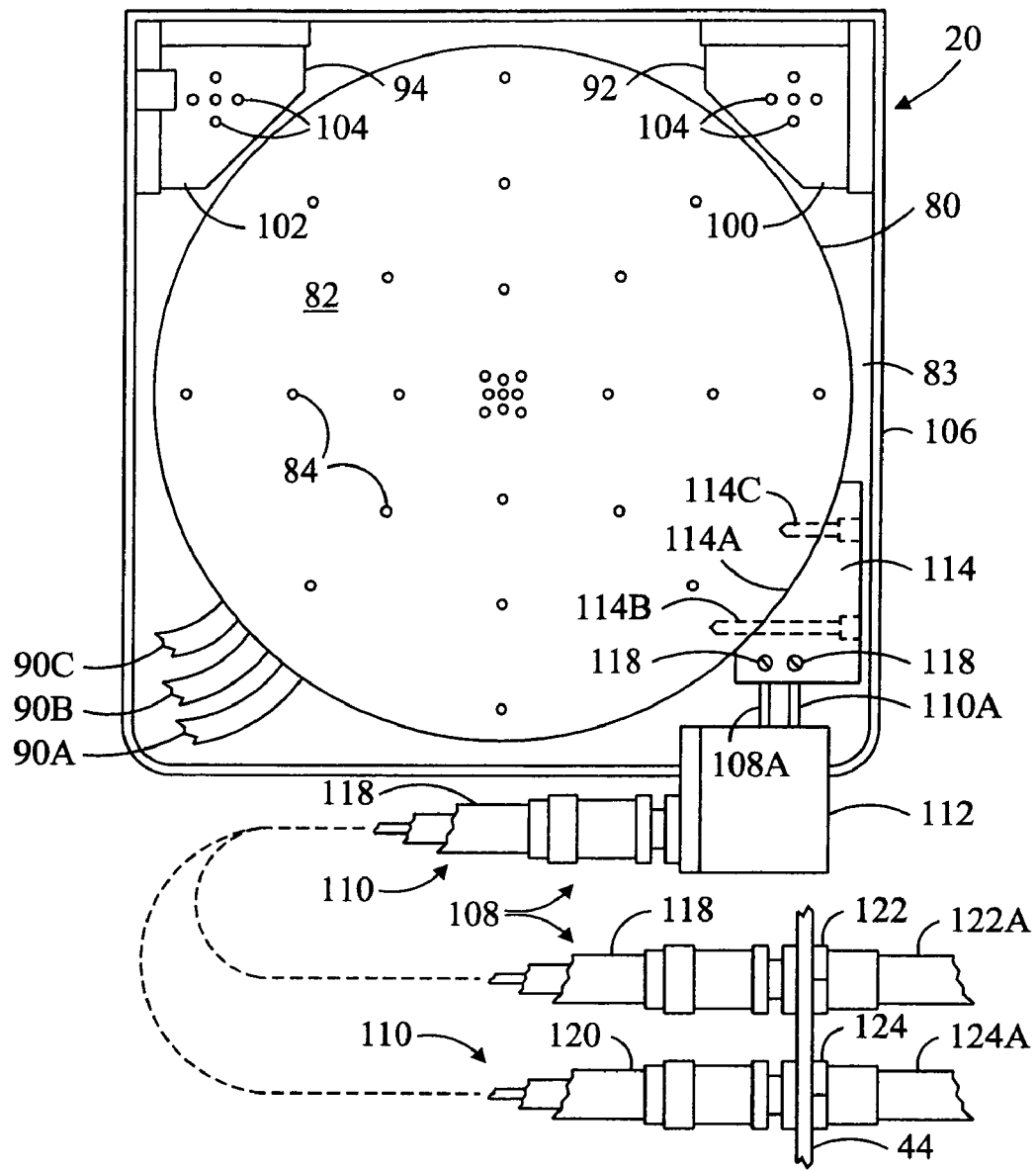
FIG. 6 is a partially schematic top detail view of the chuck assembly, taken along line 6-6 of FIG. 3.
Figure 7:
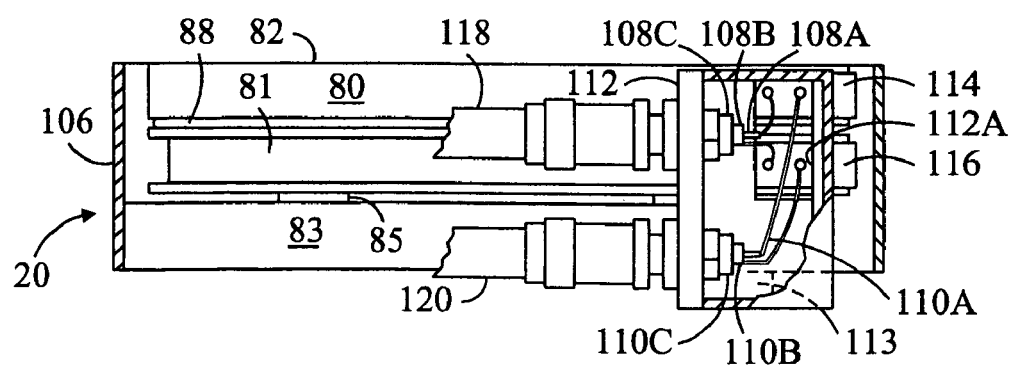
FIG. 7 is a partially sectional front view of the chuck assembly of FIG. 6.

Frequently in the construction of a chuck, a pair of cables are connected to the chuck, either in the manner shown in FIGS. 6 and 7, or otherwise the two cables 118 and 120 are each separately connected directly to the exterior periphery of the chuck 82. In this manner the conductive periphery of the chuck acts as a common signal path for both of the cables.

With particular regard to chucks that are specially adapted for use in measuring ultra-low current (down to the femtoamp region or lower), chuck designers have been concerned with developing techniques for eliminating or at least reducing the effects of leakage currents, which are unwanted currents that can flow into a particular cable or channel from surrounding cables or channels so as to distort the current measured in that particular cable or channel.

One technique that has been used for suppressing undesired leakage currents is surrounding the inner core of each lead-in wire with a cylindrical "guard" conductor, where the "guard" conductor is maintained at the same potential as the inner core by a feedback circuit in the output channel of the test instrument. Because the voltage potentials of the outer guard conductor and the inner conductive core are made to substantially track each other, negligible leakage current will flow across the inner dielectric that separates these conductors regardless of whether the inner dielectric is made of a low- or high-resistivity material. Although leakage current can still flow between the guard conductors of the respective cables, this is typically not a problem because these guard conductors, unlike the inner conductive cores, are at low impedance. By using this guarding technique, significant improvement may be realized in the low-level current measuring capability of certain probe card designs.

It has been found, however, that even with the use of guarded cables of the type just described, the level of undesired background current is still not sufficiently reduced as to match the capabilities of the latest generation of commercially available test instruments, which instruments are able to monitor currents down to one femtoamp or less.

To further increase measurement accuracy, ideally in a two lead coaxial cable system a "true Kelvin" connection is constructed. This involves using what is generally referred to as a force signal and a sense signal. The signal conductor from one of the coaxial cables is considered the force conductor, while the signal conductor from the other coaxial cable is considered the sense conductor. The force conductor is a low impedance connection, so a current is forced through the force conductor for testing purposes. The sense conductor is a high impedance connection, preferably in close proximity to the sense conductor, in order to sense the voltage. As such the current versus voltage characteristics of the test device can be obtained using the force and sense conductors.

To calibrate the "true Kelvin" connection, first an open circuit test is performed to measure the capacitance without the load capacitance. This is performed by disconnecting the probes and shorting the probe tips of the sense and force conductors together with both suspended in air. The open circuit test is difficult to perform. Second, a short circuit test is performed to measure the capacitance when the force and sense conductors are on the load. From the open circuit test and the short circuit test the cable impedance is obtained and thereafter used for offsetting during subsequent measurements. Unfortunately, calibration of a "true Kelvin" connection is difficult and time consuming to perform. Additionally, the current flowing through the force conductor is generally known but the resistance drop along the length of force conductor results in the exact voltage at its end to be unknown, therefore the measurement can be inaccurate.

A quasi-Kelvin measurement maybe considered when the force and sense are combined together prior to the device being measured. This is the case when the chuck is considered part of the joint signal path to the wafer, or the force and sense are joined together as illustrated in FIGS. 6 and 7. The length of the signal path extending from the point that the force conductor and sense conductor are connected together carries current during measurements which results in a voltage drop from any internal resistance in that portion of the signal path. The assumption is that for low current applications, the voltage drop due to the resistance is small because the junction is close to the measurement point and the conductor has low resistance.

There is a desire to measure the drain to source resistance of semiconductor based FETs (e.g., Rds), which is normally the connection between the source and the conductive backside metal on the wafer, which is acting as a join drain. The Rds resistance is typically measured with the gate to source of the FET being biased to induce the conductive channel. It is to be expected that using a Kelvin connection that an extremely accurate measurement of the Rds resistance may be obtained. When making such a measurement it turns out that the Rds is about 40 milli-ohms which is many times greater than the expected value (e.g. 8 milli-ohms).

Figure 8:
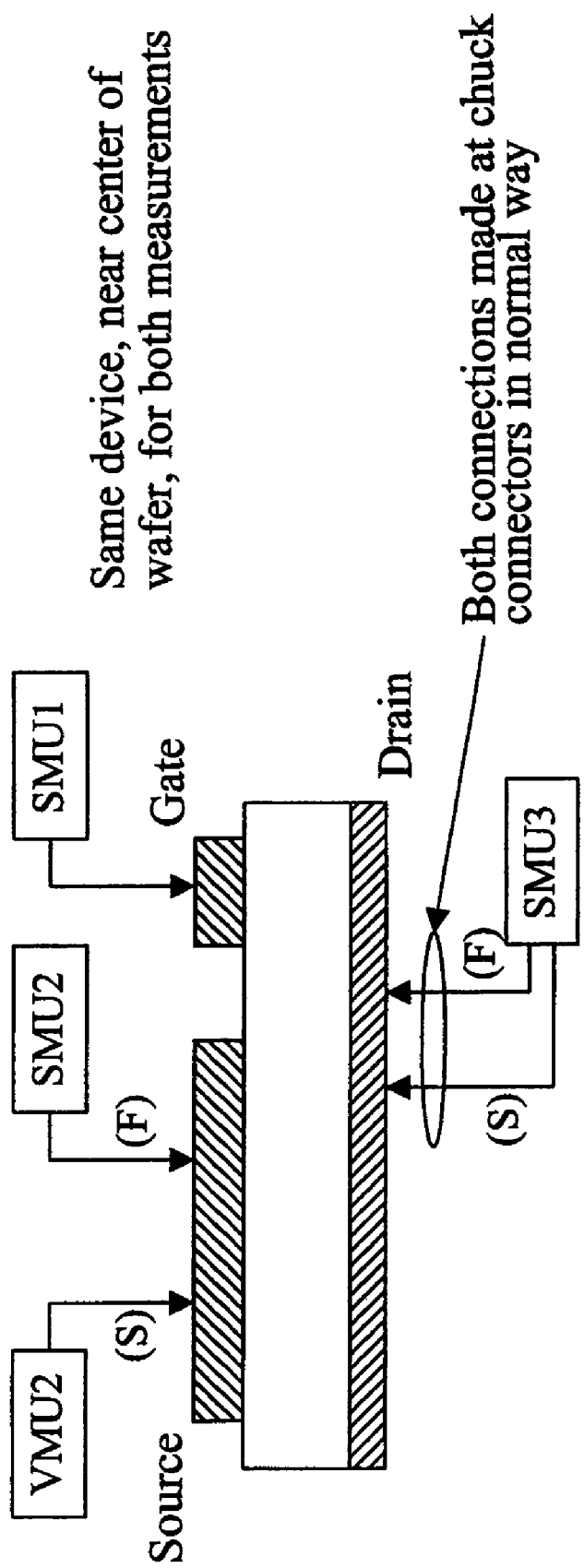
FIG. 8 illustrates a measurement setup.

The measurement setup to perform this measurement is shown in FIG. 8. A source measurement unit 1 is connected to the gate to sweep a voltage, a source measurement unit 2 is connected to the source of the FET to provide a source connection. A voltage measurement unit 2 is connected to the source of the FET to provide a force connection. A source measurement unit 3 provides both a source connection and a force connection to the drain of the FET.

Figure 9:
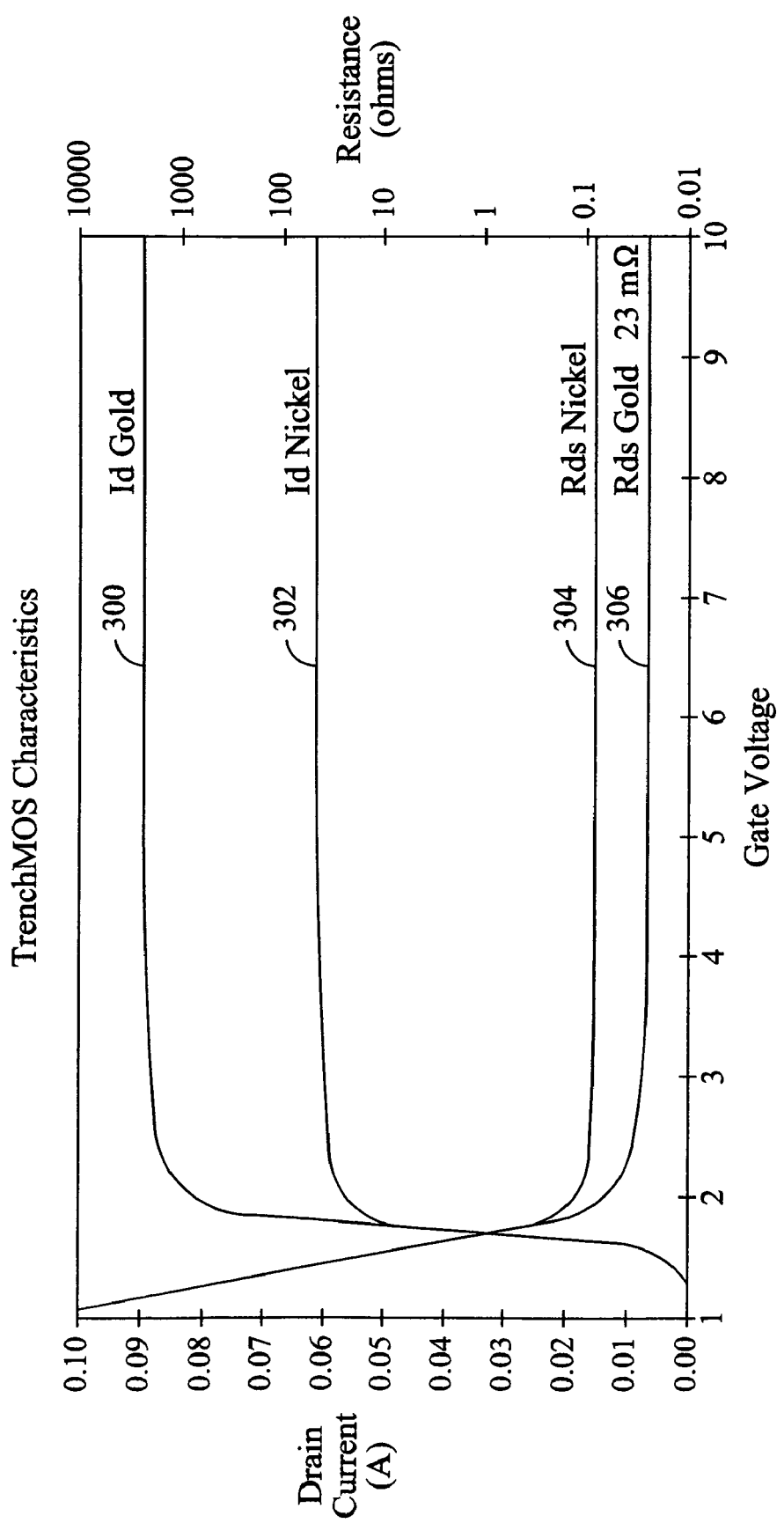
FIG. 9 illustrates trench MOS characteristics for the setup of FIG. 8.

Referring to FIG. 9 it is shown, to the surprise of the present inventors, that the drain current 300 for a gold coated chuck surface is much greater than the drain current 302 for a nickel coated chuck surface. Similarly, it is shown to the surprise of the present inventors, that the Rds 304 for the nickel coated chuck surface is much greater than the Rds 306 for the gold coated chuck surface. It is unexpected that the difference between using a nickel surface and a gold surface of the chuck would result in such a difference, especially since both are of low resistance and conductive, and accordingly a gold surface for the chuck is preferable.

Figure 10:
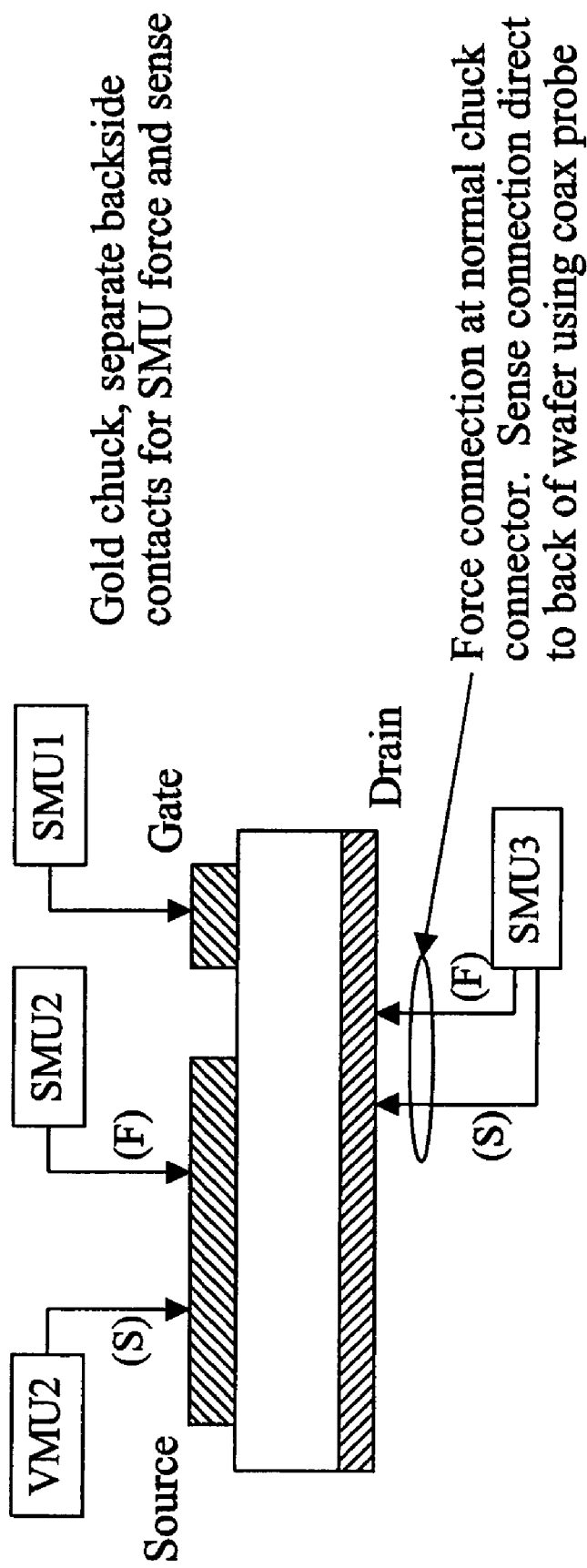
FIG. 10 illustrates another measurement setup.
Figure 11:
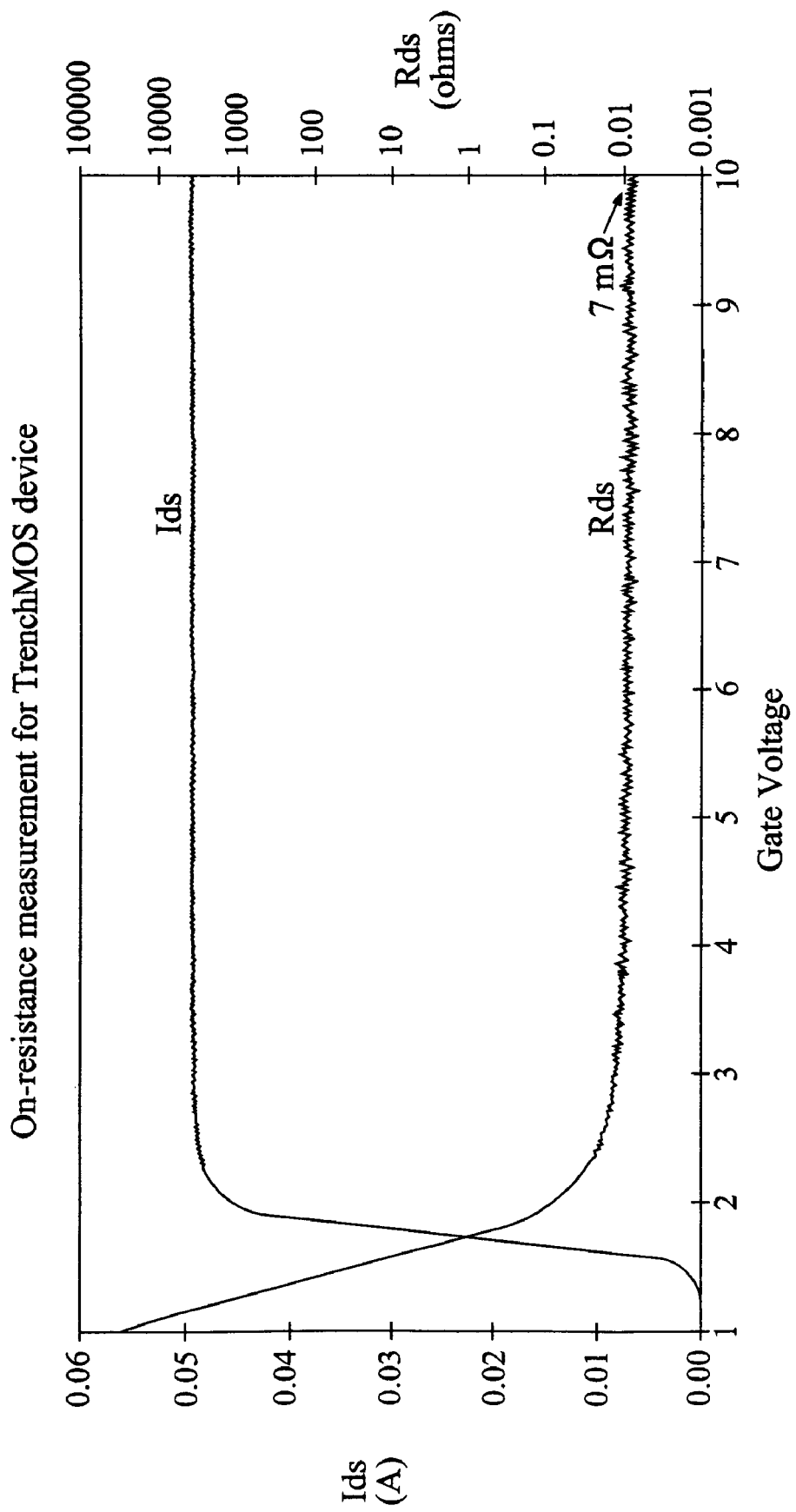
FIG. 11 illustrates trench MOS characteristics for the setup of FIG. 10.

The unexpected difference in the surface coatings lead the present inventors to consider that perhaps there is a previously unconsidered embedded resistance somewhere in the conductive path that is resulting in the difference in the measurements. To investigate this the present inventors modified the chuck connection arrangement on the drain. Rather than modify the electrical connections themselves in a typical manner, the present inventors physically arranged the wafer in a manner that was slightly overhanging with the edge of the gold coated chuck. The force connection was made in the same manner as FIG. 8, while the sense connection was made using a probe with the needle in direct contact with the back of the wafer in the small area overhanging the chuck, as denoted on FIG. 10. The result of this modified measurement is shown in FIG. 11. To the present inventors surprise the Rds measurement was as expected, though the measurement using the traditional Kelvin type connection unexpectedly provided an inaccurate measurement. While making such a measurement using direct connection to the backside of the wafer is possible, it would be desirable to include a similar functionality within the chuck itself. Apparently in reflection, the present inventors came to the realization that any backside oxidation, contamination, film, or otherwise, may build up on the wafer and/or chuck surfaces in a manner sufficient to modify the measurements sufficiently, especially at such low measurement values.

Figure 12:
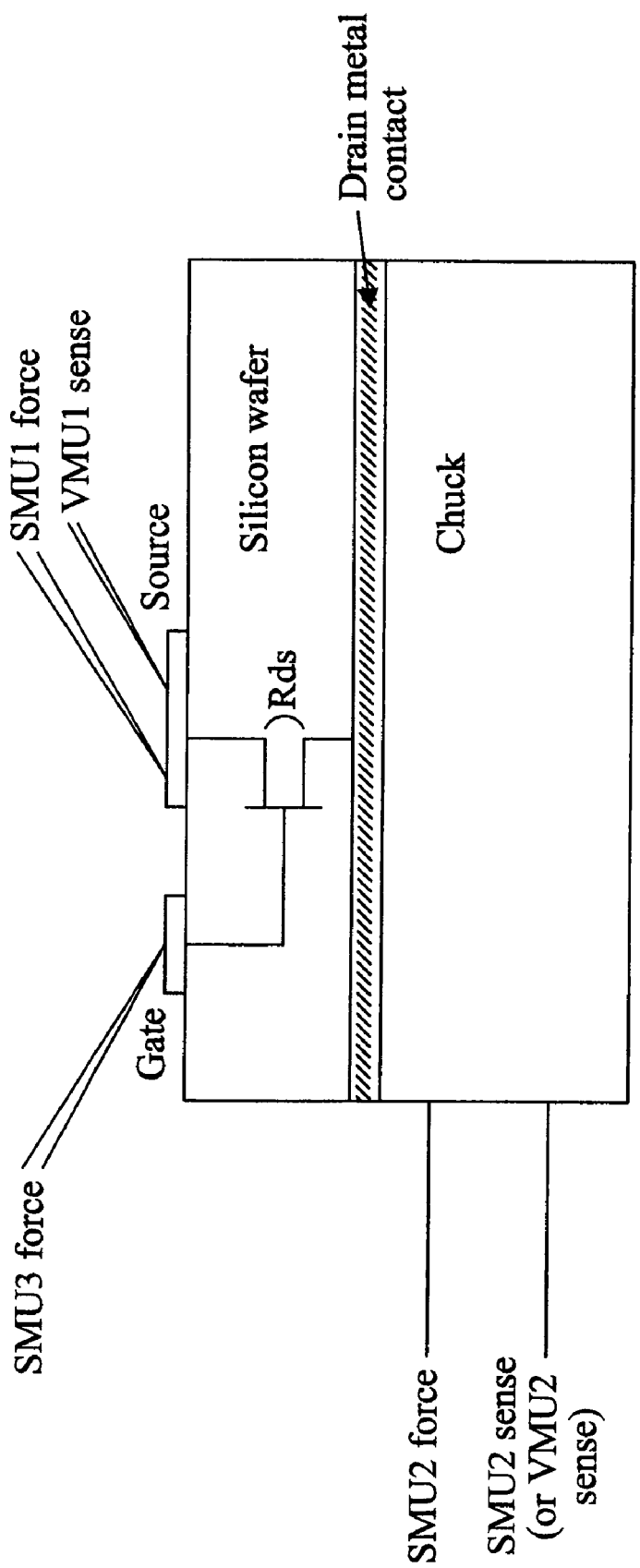
FIG. 12 illustrates another measurement setup.

Referring to FIG. 12, the measurement issue may be presented schematically where Rds is given by:

$$Rds=(VMU1-VMU2)/Ids$$

Figure 13:
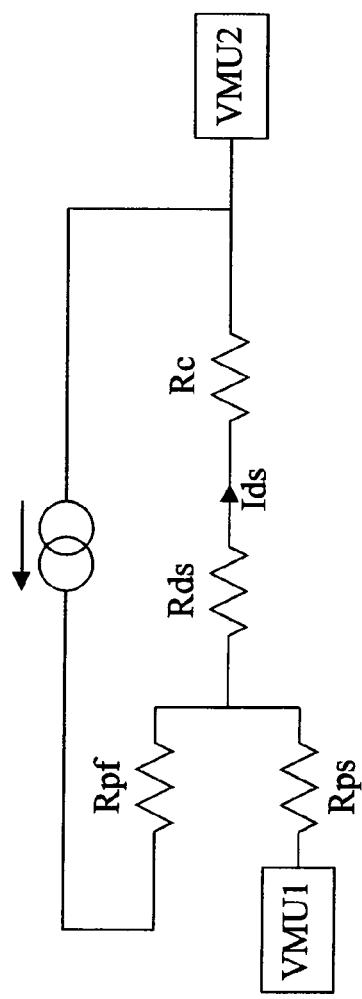
FIG. 13 illustrates an equivalent circuit for the setup of FIG. 12.

The equivalent circuit for this measurement is represented in FIG. 13. In the diagram Rpf is the probe contact resistance on the source for the force contact and Rps is the probe contact resistance for the sense contact. Rpf does not need to be equal to Rps because the VMU 1 measurement impedance is very high and the resulting measurement current is very low compared with the current flowing from source to drain. The voltage (Rpf .times.Ids) does not therefore form a significant part of the measurement of VMU1.

On the other hand, the contact resistance between the chuck and the drain metal, Rc does affect the measurement because it is common to both the force part of the circuit and the sense connection made by VMU2. Thus instead of measuring the voltage dropped only across Rds, the difference between VMU1 and VMU2 divided by Ids gives the sum of Rds and Rc. In this configuration Rds and Rc cannot be separated. In many cases Rc and Rds are most likely comparable in magnitude for the type of device measurements of interest. This will therefore result in a large error in the measurement of Rds using this technique. In the case of the gold chuck in the measurement in FIG. 9 the error is more than 100% and in the case of the nickel chuck of FIG. 9 the error is more than 700%.

Accordingly, the present inventors came to the realization that the problem that exists is that the measurement terminal for VMU2 should be between Rds and Rc so that a true measurement of Rds may be performed.

Figure 14:
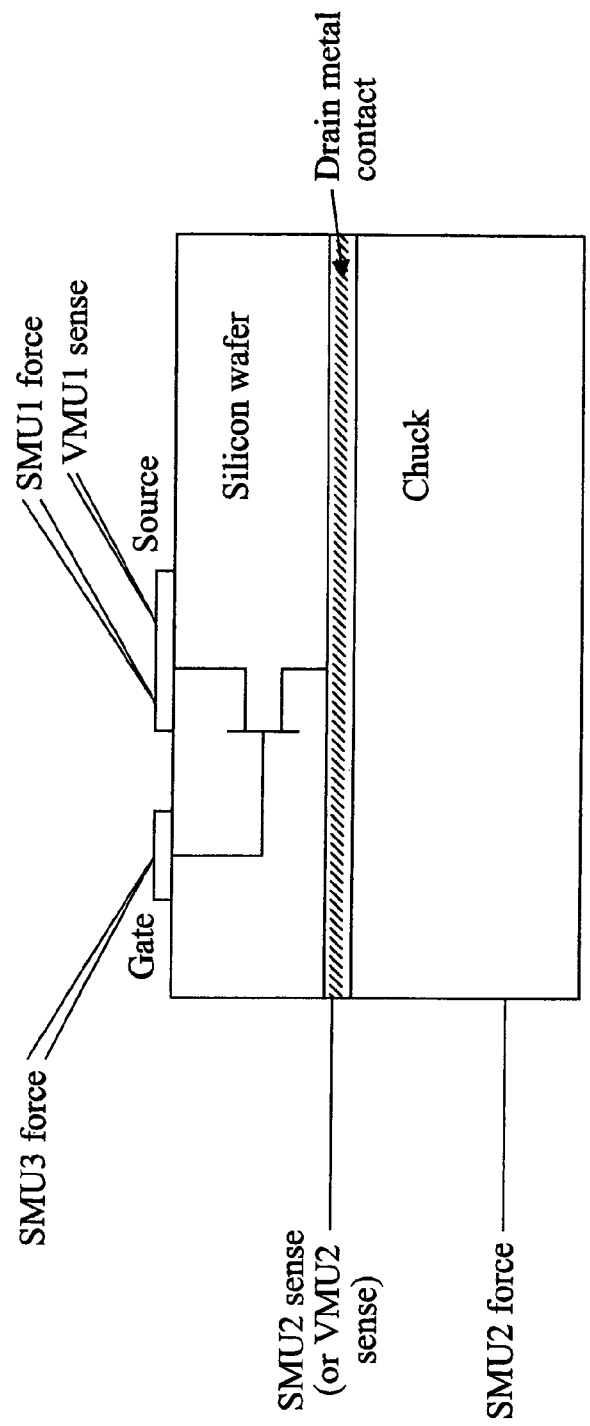
FIG. 14 illustrates another measurement setup.

Referring to FIG. 14, to create such a change in the measurement terminal for VMU2 the sense connection is made in a more direct matter to the drain metal contact of the wafer. This may be accomplished by, for example, having a small area of the chuck surface insulated from the remainder of the chuck surface and making contact from the VMU2 sense connection to that region of the chuck surface.

Figure 15:
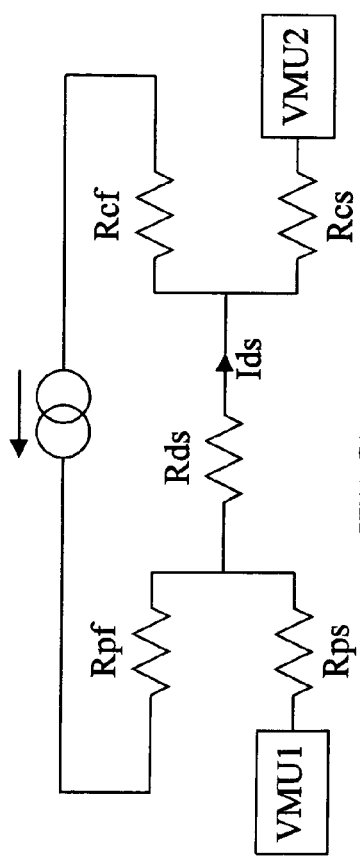
FIG. 15 illustrates an equivalent circuit for the setup of FIG. 14.

The equivalent circuit for this arrangement is shown in FIG. 15. As it is shown that the previous resistance Rc has been replaced with a chuck contact resistance, Rcf, for the force connection. This value will be a relatively low value, but perhaps larger than the value of Rds to be measured. The chuck sense connection has a contact resistance, Rcs. This may be a much higher value than Rcf. However, it does not matter what the value of Rcf is since it serves only to provide a connection to VMU2 which itself has a high impedance.

Figure 16:
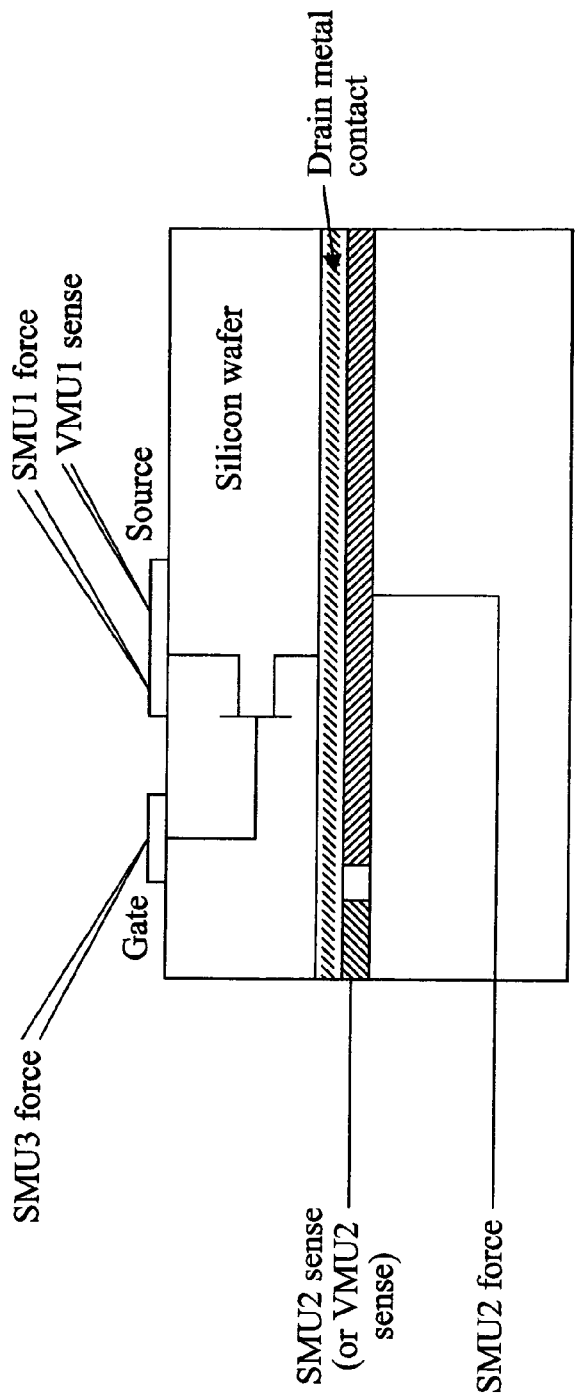
FIG. 16 illustrates another measurement setup and modified chuck.

Thus VMU2 is now able to sense the voltage directly at the drain metal contact. Therefore, even if this second contact is small, and perhaps a long way from the device under test location, the added resistance between the device contact and the VMU it not important. An example configuration is illustrated in FIG. 16, where the VMU2 sense connection is electrically isolated from the SMU2 force connection.

The exact conditions under which the resistances Rps and Rcs can be neglected depend on the input impedance of the VMUs which in turn determine the ratio of the their measurement currents to Ids. Even with low Ids values in the 50 mA range, the VMU measurement current should be negligible. It is to be understood that even under drastically different probing conditions the teachings herein may likewise be applied.

Applying the usual circuit equations and Ohm's Law one may write:

$$V_d - V_s \left( \frac{I_{ds}}{I_{ds} - I_{VMU2}} \right) = I_{ds} \left( R_{ds} + \frac{R_{cf}^2}{R_{cf} + R_{cs} + Z} \right)$$

These conditions which must be satisfied to ensure that $$R_{ds} = \frac{V_d - V_s}{I_{ds}}$$

is accurate according to the measurements of Vd, Vs and Ids are:

$$\frac{R_{cf}}{R_{cf} + R_{cs} + Z} \ll 1 \quad \text{and} \quad \frac{R_{cf}^2}{R_{cf} + R_{cs} + Z} \approx 0$$

where Z is the input impedance of the VMU.

These conditions are essentially identical and both may be satisfied when the input impedance of the VMU is much greater than the various contact resistances in the measurement circuit. It is noted that any resistance common to both the 'force' and the 'sense' contacts for either probe or chuck will lead to errors in the Rds measurement, so these resistances should be minimized.

Figure 17:
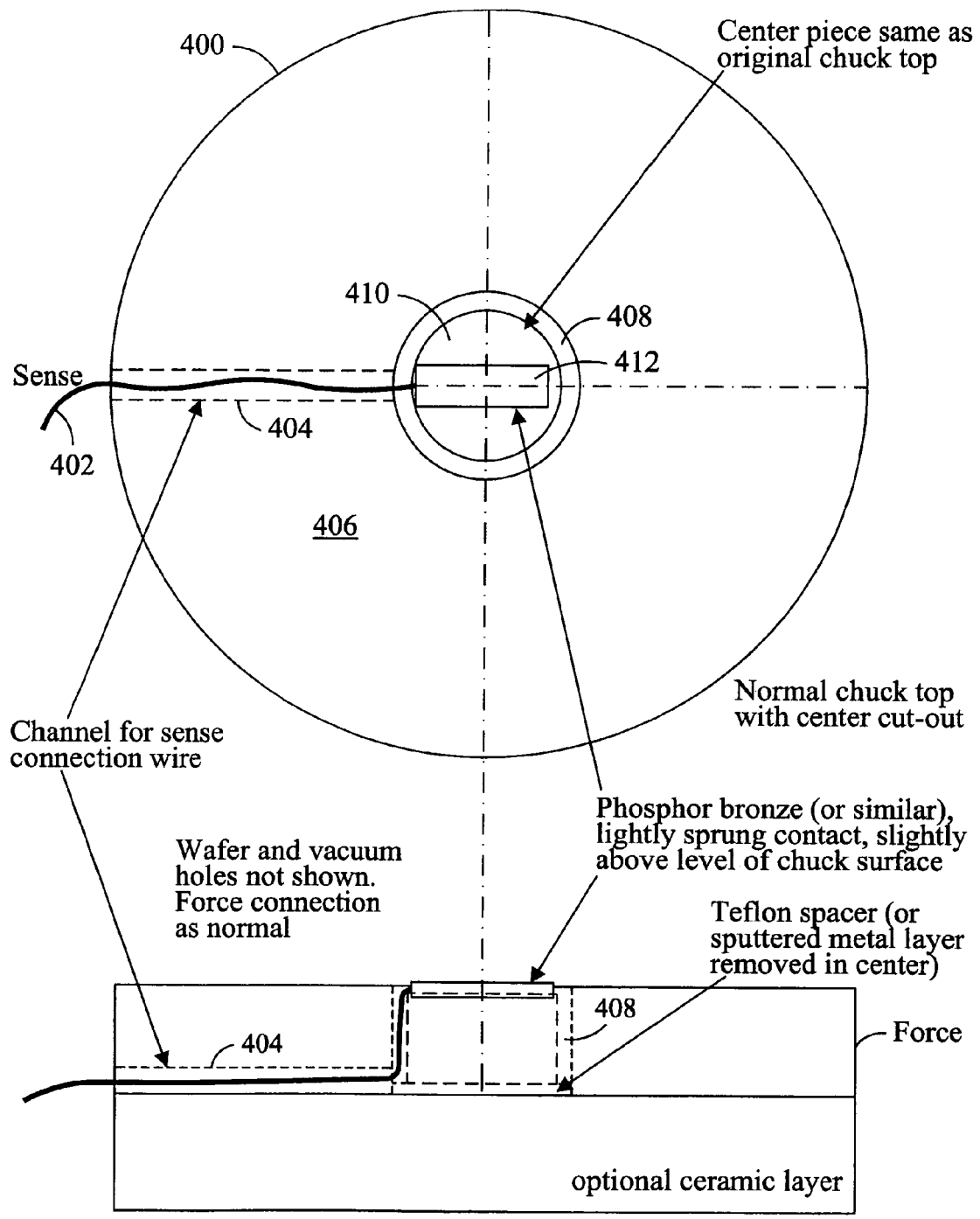
FIG. 17 illustrates another modified chuck.

While the embodiment illustrated in FIG. 16 is acceptable, another embodiment is illustrated in FIG. 17. FIG. 17 may be the chuck itself 400 or a plate supported by the chuck, typically using vacuum. The sense conductor 402 may pass within the chuck through an opening 404. The top 406 of the chuck is conductive and supports the wafer thereon. An dielectric spacer 408 may be included or otherwise a gap in the top 406 of the chuck. A central conductive region 410 may be included that has substantially the same elevation as the top 406 of the chuck. The central region 410 may include a flexible contact 412 that is biased such that a portion of the flexible contact 412 is depressed upon placing a waver upon the chuck 400. In this manner a good contact is made between the flexible contact and the wafer. In this manner, the central region connected to the sense connection is electrically isolated from the force connection connected to the remainder of the chuck. Other suitable interconnections may likewise be used, where the force and sense connections are isolated to a point in contact with the wafer itself, such that the wafer provides the interconnection between the force and sense connection.

Figure 18:
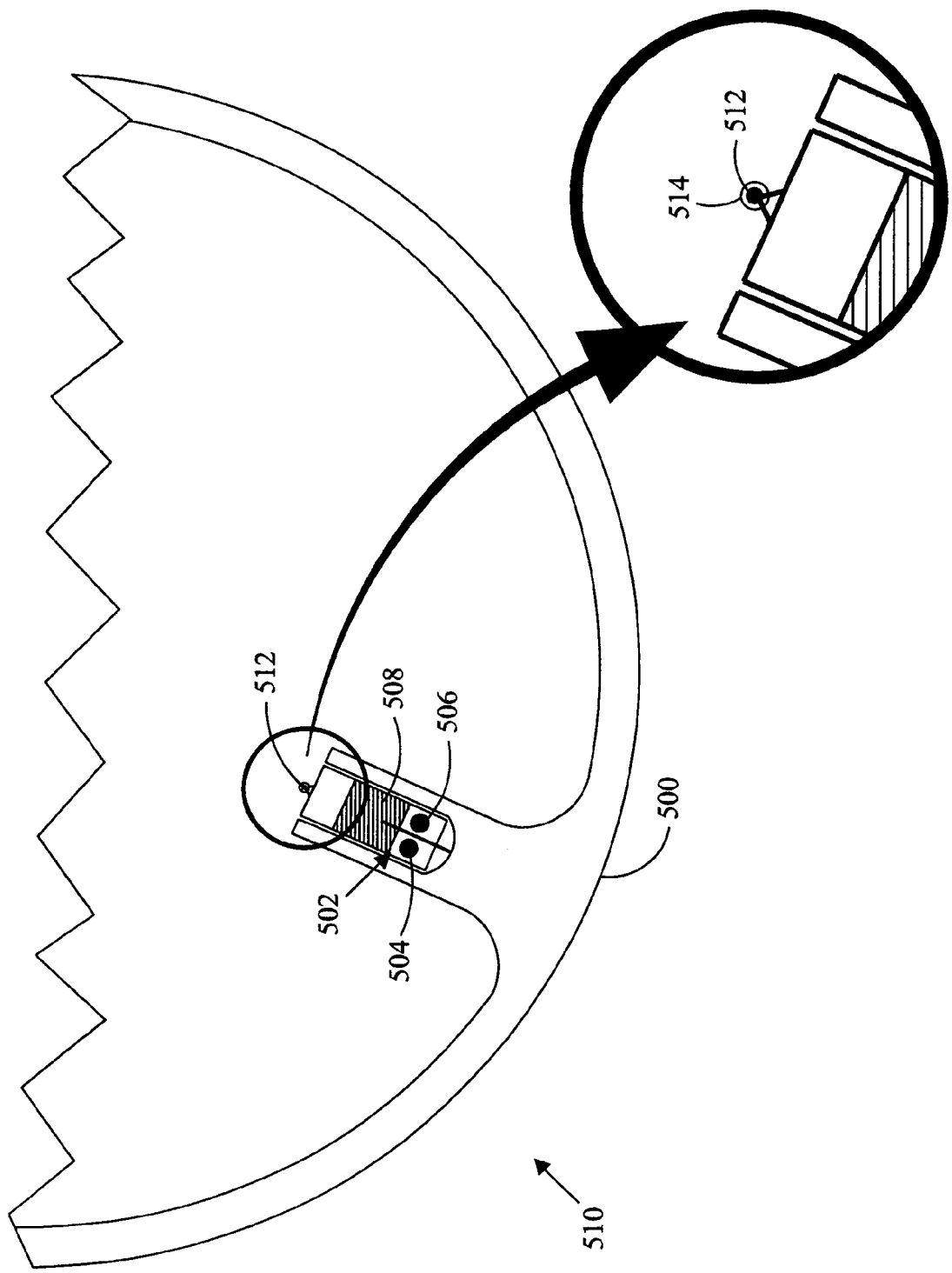
FIG. 18 illustrates another modified chuck.

Referring to FIG. 18, another embodiment includes a sense conductor 500 that is electrically interconnected to a contact assembly 502 on the reverse of a plate assembly 510 to be supported by the chuck. The contact assembly 502 includes a pair of screws 504 and 506 securing a flexible conductive member 508 within a depression in the plate assembly 510. The flexible conductive member 508 is electrically interconnected to a conductive pin 512. The conductive pin 512 may be surrounded by an insulator 514, if desired. The conductive pin 512 and insulator 514 extends through the plate assembly 510 to a position slightly above the surface of the front surface of the plate assembly 510. The conductive pin 512, flexible conductive member 508, sense conductor 500 are electrically isolated from the remainder of the plate assembly 510 which acts as part of the force path for making measurements (e.g., chuck to plate assembly to wafer). The plate assembly 510 is secured to the chuck, such as using vacuum, and a contact is made to the wafer by depressing the conductive pin 512. In this manner, separate paths for the force and sense conductors are maintained to the wafer.

We claim:

1. A probe station for probing a device under test comprising:
   (a) a chuck having an upper surface suitable to support said device under test;
   (b) a first conductive element defining a first signal path to said upper surface of said chuck, said signal path electrically isolated from said upper surface of said chuck, said conductive element in electrical contact with said device under test when said device under test is at least partially supported by said upper surface of said chuck, said signal path extending through at least a portion of said chuck; and
   (c) a second conductive element defining a second signal path, which is a test signal path, electrically isolated from said first signal path, free of direct electrical contact with said upper surface of said chuck and in electrical contact with said device under test when said device under test is at least partially supported by said upper surface of said chuck, said second signal path not extending through at least a portion of said chuck.

2. The chuck if claim 1 where said first signal path is a sense signal path.

3. A probe station for probing a device under test having a probing surface, said probe station comprising:
   (a) a chuck having an upper surface suitable to support said device under test;
   (b) a first conductive element defining a first signal path to said upper surface of said chuck, said signal path electrically isolated from said upper surface of said chuck, said conductive element in electrical contact with said device under test when said device under test is at least partially supported by said upper surface of said chuck, said signal path extending through at least a portion of said chuck; and
   (c) a second conductive element defining a second signal path, which is a test signal path, electrically isolated from said first signal path, free of direct electrical contact with said upper surface of said chuck and in electrical contact with said device under test when said device under test is at least partially supported by said upper surface of said chuck, said second signal path not extending through at least a portion of said chuck.

4. The chuck of claim 3 where said first signal path is a sense signal path.

* * * * *